(12) United States Patent
Smith et al.

(10) Patent No.: US 7,492,175 B2
(45) Date of Patent: *Feb. 17, 2009

(54) MEMBRANE PROBING SYSTEM

(75) Inventors: Kenneth Smith, Portland, OR (US);
Reed Gleason, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/008,594

(22) Filed: Jan. 10, 2008

(65) Prior Publication Data

US 2008/0111571 A1    May 15, 2008

Related U.S. Application Data

(63) Continuation of application No. 10/223,863, filed on Aug. 19, 2002, now Pat. No. 7,355,420.

(60) Provisional application No. 60/314,155, filed on Aug. 21, 2001.

(51) Int. Cl.
*G01R 31/02* (2006.01)
*G01R 31/26* (2006.01)

(52) U.S. Cl. .................. 324/754; 324/755; 324/765

(58) Field of Classification Search .......... 324/754–765
See application file for complete search history.

(56) References Cited

U.S. PATENT DOCUMENTS

| | | | |
|---|---|---|---|
| 1,337,866 | A | 4/1920 | Whitacker |
| 2,142,625 | A | 1/1939 | Zoethout |
| 2,376,101 | A | 5/1945 | Tyzzer |
| 2,389,668 | A | 11/1945 | Johnson |
| 3,176,091 | A | 3/1965 | Hanson et al. |
| 3,193,712 | A | 7/1965 | Harris |
| 3,230,299 | A | 1/1966 | Radziekowski |
| 3,401,126 | A | 9/1968 | Miller et al. |

(Continued)

FOREIGN PATENT DOCUMENTS

CN    1083975    3/1994

(Continued)

OTHER PUBLICATIONS

Fink, Donald G., et. al., "Bridge Circuits, Detectors and Amplifiers—Principles of Bridge Measurements," Electronics Engineer's Handbook, First Edition, 1975, pp. 17-22-17-27, McGraw-Hill Book Company, New York.

(Continued)

*Primary Examiner*—Ha Tran T Nguyen
*Assistant Examiner*—Emily Y Chan
(74) *Attorney, Agent, or Firm*—Chernoff, Vilhauer, McClung & Stenzel

(57) ABSTRACT

A membrane probing assembly includes a probe card with conductors supported thereon, wherein the conductors include at least a signal conductor located between a pair of spaced apart guard conductors. A membrane assembly includes a membrane with contacts thereon, and supporting at least a signal conductor located between a pair of spaced apart guard conductors. The guard conductors of the probe card are electrically interconnected proximate the interconnection between the probe card and the membrane assembly. The guard conductors of the membrane assembly are electrically interconnected proximate the interconnection between the probe card and the membrane assembly.

6 Claims, 24 Drawing Sheets

U.S. PATENT DOCUMENTS

| | | |
|---|---|---|
| 3,429,040 A | 2/1969 | Miller |
| 3,441,315 A | 4/1969 | Paes et al. |
| 3,442,831 A | 5/1969 | Dickstein |
| 3,445,770 A | 5/1969 | Harmon |
| 3,484,679 A | 12/1969 | Hodgson et al. |
| 3,541,222 A | 11/1970 | Parks et al. |
| 3,595,228 A | 7/1971 | Simon |
| 3,596,228 A | 7/1971 | Reed, Jr. et al. |
| 3,609,539 A | 9/1971 | Gunthert |
| 3,634,807 A | 1/1972 | Grobe et al. |
| 3,654,585 A | 4/1972 | Wickersham |
| 3,680,037 A | 7/1972 | Nellis et al. |
| 3,700,998 A | 10/1972 | Lee et al. |
| 3,710,251 A | 1/1973 | Hagge et al. |
| 3,714,572 A | 1/1973 | Ham et al. |
| 3,740,900 A | 6/1973 | Youmans et al. |
| 3,806,801 A | 4/1974 | Bove |
| 3,829,076 A | 8/1974 | Sofy |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,008,900 A | 2/1977 | Khoshaba |
| 4,027,935 A | 6/1977 | Byrnes et al. |
| 4,038,599 A | 7/1977 | Bove et al. |
| 4,038,894 A | 8/1977 | Knibbe et al. |
| 4,049,252 A | 9/1977 | Bell |
| 4,066,943 A | 1/1978 | Roch |
| 4,072,576 A | 2/1978 | Arwin et al. |
| 4,093,988 A | 6/1978 | Scott |
| 4,099,120 A | 7/1978 | Aksu |
| 4,115,735 A | 9/1978 | Stanford |
| 4,135,131 A | 1/1979 | Larsen et al. |
| 4,184,729 A | 1/1980 | Parks et al. |
| 4,275,446 A | 6/1981 | Blaess |
| 4,277,741 A | 7/1981 | Faxvog et al. |
| 4,284,033 A | 8/1981 | del Rio |
| 4,284,682 A | 8/1981 | Tshirch et al. |
| 4,287,473 A | 9/1981 | Sawyer |
| 4,312,117 A | 1/1982 | Robillard et al. |
| 4,327,180 A | 4/1982 | Chen |
| 4,330,783 A | 5/1982 | Toia |
| 4,357,575 A | 11/1982 | Uren et al. |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,487,996 A | 12/1984 | Rabinowitz et al. |
| 4,515,133 A | 5/1985 | Roman |
| 4,515,439 A | 5/1985 | Esswein |
| 4,528,504 A | 7/1985 | Thornton, Jr. et al. |
| 4,531,474 A | 7/1985 | Inuta |
| 4,552,033 A | 11/1985 | Marzhauser |
| 4,567,321 A | 1/1986 | Harayama |
| 4,581,679 A | 4/1986 | Smolley |
| 4,588,950 A | 5/1986 | Henley |
| 4,593,243 A | 6/1986 | Lao et al. |
| 4,621,169 A | 11/1986 | Petinelli et al. |
| 4,626,618 A | 12/1986 | Takaoka et al. |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,663,840 A | 5/1987 | Ubbens et al. |
| 4,673,839 A | 6/1987 | Veenendaal |
| 4,684,883 A | 8/1987 | Ackerman et al. |
| 4,691,163 A | 9/1987 | Blass et al. |
| 4,697,143 A | 9/1987 | Lockwood et al. |
| 4,705,447 A | 11/1987 | Smith |
| 4,707,657 A | 11/1987 | Bøegh-Peterson |
| 4,711,563 A | 12/1987 | Lass |
| 4,713,347 A | 12/1987 | Mitchell et al. |
| 4,725,793 A | 2/1988 | Igarashi |
| 4,727,391 A | 2/1988 | Tajima et al. |
| 4,727,637 A | 3/1988 | Buckwitz et al. |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,746 A | 7/1988 | Mallory et al. |
| 4,755,747 A | 7/1988 | Sato |
| 4,755,874 A | 7/1988 | Esrig et al. |
| 4,757,255 A | 7/1988 | Margozzi |
| 4,766,384 A | 8/1988 | Kleinberg et al. |
| 4,772,846 A | 9/1988 | Reeds |
| 4,780,670 A | 10/1988 | Cherry |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,812,754 A | 3/1989 | Tracy et al. |
| 4,827,211 A | 5/1989 | Strid et al. |
| 4,831,494 A | 5/1989 | Arnold et al. |
| 4,837,507 A | 6/1989 | Hechtman |
| 4,839,587 A | 6/1989 | Flatley et al. |
| 4,849,689 A | 7/1989 | Gleason et al. |
| 4,853,624 A | 8/1989 | Rabjohn |
| 4,853,627 A | 8/1989 | Gleason et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,891,584 A | 1/1990 | Kamieniecki et al. |
| 4,893,914 A | 1/1990 | Hancock et al. |
| 4,894,612 A | 1/1990 | Drake et al. |
| 4,899,998 A | 2/1990 | Teramachi |
| 4,904,933 A | 2/1990 | Snyder et al. |
| 4,904,935 A | 2/1990 | Calma et al. |
| 4,906,920 A | 3/1990 | Huff et al. |
| 4,912,399 A | 3/1990 | Greub et al. |
| 4,916,002 A | 4/1990 | Carver |
| 4,916,398 A | 4/1990 | Rath |
| 4,918,383 A | 4/1990 | Huff et al. |
| 4,922,128 A | 5/1990 | Dhong et al. |
| 4,922,186 A | 5/1990 | Tsuchiya et al. |
| 4,922,192 A | 5/1990 | Gross et al. |
| 4,929,893 A | 5/1990 | Sato et al. |
| 4,975,638 A | 12/1990 | Evans et al. |
| 4,980,637 A | 12/1990 | Huff et al. |
| 4,983,910 A | 1/1991 | Majidi-Ahy et al. |
| 4,987,100 A | 1/1991 | McBride et al. |
| 4,991,290 A | 2/1991 | MacKay |
| 4,998,062 A | 3/1991 | Ikeda |
| 5,001,423 A | 3/1991 | Abrami et al. |
| 5,003,253 A | 3/1991 | Majidi-Ahy et al. |
| 5,020,219 A | 6/1991 | Leedy |
| 5,021,186 A | 6/1991 | Ota et al. |
| 5,030,907 A | 7/1991 | Yih et al. |
| 5,041,782 A | 8/1991 | Marzan |
| 5,045,781 A | 9/1991 | Gleason et al. |
| 5,059,898 A | 10/1991 | Barsotti et al. |

| | | | | | |
|---|---|---|---|---|---|
| 5,061,192 A | 10/1991 | Chapin et al. | 5,412,330 A | 5/1995 | Ravel et al. |
| 5,061,823 A | 10/1991 | Carroll | 5,412,866 A | 5/1995 | Woith et al. |
| 5,066,357 A | 11/1991 | Smyth, Jr. et al. | 5,414,565 A | 5/1995 | Sullivan et al. |
| 5,069,628 A | 12/1991 | Crumly | 5,422,574 A | 6/1995 | Kister |
| 5,082,627 A | 1/1992 | Stanbro | 5,441,690 A | 8/1995 | Ayala-Esquilin et al. |
| 5,084,671 A | 1/1992 | Miyata et al. | 5,451,722 A | 9/1995 | Gregoire |
| 5,089,774 A | 2/1992 | Nakano | 5,451,884 A | 9/1995 | Sauerland |
| 5,091,692 A | 2/1992 | Ohno et al. | 5,453,404 A | 9/1995 | Leedy |
| 5,091,732 A | 2/1992 | Mileski et al. | 5,457,398 A | 10/1995 | Schwindt et al. |
| 5,095,891 A | 3/1992 | Reitter | 5,467,024 A | 11/1995 | Swapp |
| 5,097,101 A | 3/1992 | Trobough | 5,469,324 A | 11/1995 | Henderson et al. |
| 5,097,207 A | 3/1992 | Blanz | 5,475,316 A | 12/1995 | Hurley et al. |
| 5,107,076 A | 4/1992 | Bullock et al. | 5,476,211 A | 12/1995 | Khandros |
| 5,126,286 A | 6/1992 | Chance | 5,477,011 A | 12/1995 | Singles et al. |
| 5,133,119 A | 7/1992 | Afshari et al. | 5,478,748 A | 12/1995 | Akins, Jr. et al. |
| 5,134,365 A | 7/1992 | Okubo et al. | 5,479,108 A | 12/1995 | Cheng |
| 5,136,237 A | 8/1992 | Smith et al. | 5,479,109 A | 12/1995 | Lau et al. |
| 5,142,224 A | 8/1992 | Smith et al. | 5,481,196 A | 1/1996 | Nosov |
| 5,145,552 A | 9/1992 | Yoshizawa et al. | 5,481,936 A | 1/1996 | Yanagisawa |
| 5,148,103 A | 9/1992 | Pasiecznik, Jr. | 5,487,999 A | 1/1996 | Farnworth |
| 5,159,264 A | 10/1992 | Anderson | 5,488,954 A | 2/1996 | Sleva et al. |
| 5,159,267 A | 10/1992 | Anderson | 5,493,070 A | 2/1996 | Habu |
| 5,159,752 A | 11/1992 | Mahant-Shetti et al. | 5,493,236 A | 2/1996 | Ishii et al. |
| 5,160,883 A | 11/1992 | Blanz | 5,500,606 A | 3/1996 | Holmes |
| 5,164,319 A | 11/1992 | Hafeman et al. | 5,505,150 A | 4/1996 | James et al. |
| 5,166,606 A | 11/1992 | Blanz | 5,506,498 A | 4/1996 | Anderson et al. |
| 5,172,049 A | 12/1992 | Kiyokawa et al. | 5,506,515 A | 4/1996 | Godshalk et al. |
| 5,172,050 A | 12/1992 | Swapp | 5,510,792 A | 4/1996 | Ono et al. |
| 5,172,051 A | 12/1992 | Zamborelli | 5,511,010 A | 4/1996 | Burns |
| 5,177,438 A | 1/1993 | Littlebury et al. | 5,512,835 A | 4/1996 | Rivera et al. |
| 5,180,977 A | 1/1993 | Huff | 5,517,126 A | 5/1996 | Yamaguchi |
| 5,187,443 A | 2/1993 | Bereskin | 5,521,518 A | 5/1996 | Higgins |
| 5,198,752 A | 3/1993 | Miyata et al. | 5,521,522 A | 5/1996 | Abe et al. |
| 5,198,753 A | 3/1993 | Hamburgen | 5,523,694 A | 6/1996 | Cole, Jr. |
| 5,202,558 A | 4/1993 | Barker | 5,528,158 A | 6/1996 | Sinsheimer et al. |
| 5,207,585 A | 5/1993 | Byrnes et al. | 5,530,372 A | 6/1996 | Lee et al. |
| 5,214,243 A | 5/1993 | Johnson | 5,531,022 A | 7/1996 | Beaman et al. |
| 5,214,374 A | 5/1993 | St. Onge | 5,532,608 A | 7/1996 | Behfar-Rad et al. |
| 5,225,037 A | 7/1993 | Elder et al. | 5,537,372 A | 7/1996 | Albrecht et al. |
| 5,227,730 A | 7/1993 | King et al. | 5,539,323 A | 7/1996 | Davis, Jr. |
| 5,232,789 A | 8/1993 | Platz et al. | 5,539,676 A | 7/1996 | Yamaguchi |
| 5,233,197 A | 8/1993 | Bowman et al. | 5,565,788 A | 10/1996 | Burr et al. |
| 5,233,306 A | 8/1993 | Misra | 5,565,881 A | 10/1996 | Phillips et al. |
| 5,245,292 A | 9/1993 | Milesky et al. | 5,569,591 A | 10/1996 | Kell et al. |
| 5,266,889 A | 11/1993 | Harwood et al. | 5,571,324 A | 11/1996 | Sago et al. |
| 5,267,088 A | 11/1993 | Nomura | 5,578,932 A | 11/1996 | Adamian |
| 5,270,664 A | 12/1993 | McMurtry et al. | 5,583,445 A | 12/1996 | Mullen |
| 5,274,336 A | 12/1993 | Crook et al. | 5,584,120 A | 12/1996 | Roberts |
| 5,280,156 A | 1/1994 | Niori et al. | 5,584,608 A | 12/1996 | Gillespie |
| 5,293,175 A | 3/1994 | Hemmie et al. | 5,589,781 A | 12/1996 | Higgins et al. |
| 5,298,972 A | 3/1994 | Heffner | 5,600,256 A | 2/1997 | Woith et al. |
| 5,304,924 A | 4/1994 | Yamano et al. | 5,601,740 A | 2/1997 | Eldrigde et al. |
| 5,313,157 A | 5/1994 | Pasiecznik, Jr. | 5,610,529 A | 3/1997 | Schwindt |
| 5,315,237 A | 5/1994 | Iwakura et al. | 5,617,035 A | 4/1997 | Swapp |
| 5,321,352 A | 6/1994 | Takebuchi | 5,623,213 A | 4/1997 | Liu et al. |
| 5,321,453 A | 6/1994 | Mori et al. | 5,623,214 A | 4/1997 | Pasiecznik, Jr. |
| 5,326,412 A | 7/1994 | Schreiber et al. | 5,628,057 A | 5/1997 | Phillips et al. |
| 5,355,079 A | 10/1994 | Evans et al. | 5,631,571 A | 5/1997 | Spaziani et al. |
| 5,357,211 A | 10/1994 | Bryson et al. | 5,633,780 A | 5/1997 | Cronin |
| 5,363,050 A | 11/1994 | Guo et al. | 5,634,267 A | 6/1997 | Farnworth et al. |
| 5,367,165 A | 11/1994 | Toda et al. | 5,635,846 A | 6/1997 | Beaman et al. |
| 5,368,634 A | 11/1994 | Hackett | 5,642,298 A | 6/1997 | Mallory et al. |
| 5,369,368 A | 11/1994 | Kassen et al. | 5,644,248 A | 7/1997 | Fujimoto |
| 5,371,654 A | 12/1994 | Beaman et al. | 5,653,939 A | 8/1997 | Hollis et al. |
| 5,373,231 A | 12/1994 | Boll et al. | 5,656,942 A | 8/1997 | Watts et al. |
| 5,374,938 A | 12/1994 | Hatazawa et al. | 5,659,421 A | 8/1997 | Rahmel et al. |
| 5,376,790 A | 12/1994 | Linker et al. | 5,666,063 A | 9/1997 | Abercrombie et al. |
| 5,389,885 A | 2/1995 | Swart | 5,669,316 A | 9/1997 | Faz et al. |
| 5,395,253 A | 3/1995 | Crumly | 5,670,322 A | 9/1997 | Eggers et al. |
| 5,397,855 A | 3/1995 | Ferlier | 5,670,888 A | 9/1997 | Cheng |
| 5,404,111 A | 4/1995 | Mori et al. | 5,672,816 A | 9/1997 | Park et al. |
| 5,408,188 A | 4/1995 | Katoh | 5,675,499 A | 10/1997 | Lee et al. |
| 5,408,189 A | 4/1995 | Swart et al. | 5,675,932 A | 10/1997 | Mauney |

| | | | | | | |
|---|---|---|---|---|---|---|
| 5,676,360 | A | 10/1997 | Boucher et al. | 5,926,951 A | 7/1999 | Khandros et al. |
| 5,685,232 | A | 11/1997 | Inoue | 5,944,093 A | 8/1999 | Viswanath |
| 5,686,317 | A | 11/1997 | Akram et al. | 5,945,836 A | 8/1999 | Sayre et al. |
| 5,700,844 | A | 12/1997 | Hedrick et al. | 5,949,383 A | 9/1999 | Hayes et al. |
| 5,704,355 | A | 1/1998 | Bridges | 5,949,579 A | 9/1999 | Baker |
| 5,715,819 | A | 2/1998 | Svenson et al. | 5,959,461 A | 9/1999 | Brown et al. |
| 5,720,098 | A | 2/1998 | Kister | 5,963,364 A | 10/1999 | Leong et al. |
| 5,723,347 | A | 3/1998 | Hirano et al. | 5,970,429 A | 10/1999 | Martin |
| 5,726,211 | A | 3/1998 | Hedrick et al. | 5,973,504 A | 10/1999 | Chong |
| 5,731,920 | A | 3/1998 | Katsuragawa | 5,974,662 A | 11/1999 | Eldridge et al. |
| 5,742,174 | A | 4/1998 | Kister et al. | 5,981,268 A | 11/1999 | Kovacs et al. |
| 5,744,383 | A | 4/1998 | Fritz | 5,982,166 A | 11/1999 | Mautz |
| 5,744,971 | A | 4/1998 | Chan et al. | 5,983,493 A | 11/1999 | Eldridge et al. |
| 5,748,506 | A | 5/1998 | Bockelman | 5,990,695 A | 11/1999 | Daugherty, Jr. |
| 5,751,252 | A | 5/1998 | Phillips | 5,993,611 A | 11/1999 | Moroney, III et al. |
| 5,756,021 | A | 5/1998 | Hedrick et al. | 5,994,152 A | 11/1999 | Khandros et al. |
| 5,767,690 | A | 6/1998 | Fujimoto | 5,995,914 A | 11/1999 | Cabot |
| 5,772,451 | A | 6/1998 | Dozier, II et al. | 5,996,102 A | 11/1999 | Haulin |
| 5,773,780 | A | 6/1998 | Eldridge et al. | 5,998,228 A | 12/1999 | Eldridge et al. |
| 5,777,485 | A | 7/1998 | Tanaka et al. | 5,998,768 A | 12/1999 | Hunter et al. |
| 5,785,538 | A | 7/1998 | Beaman et al. | 5,998,864 A | 12/1999 | Khandros et al. |
| 5,792,668 | A | 8/1998 | Fuller et al. | 5,999,268 A | 12/1999 | Yonezawa et al. |
| 5,793,213 | A | 8/1998 | Bockelman et al. | 6,001,760 A | 12/1999 | Katsuda et al. |
| 5,794,133 | A | 8/1998 | Kashima | 6,002,426 A | 12/1999 | Back et al. |
| 5,804,607 | A | 9/1998 | Hedrick et al. | 6,013,586 A | 1/2000 | McGhee et al. |
| 5,804,982 | A | 9/1998 | Lo et al. | 6,019,612 A | 2/2000 | Hasegawa et al. |
| 5,804,983 | A | 9/1998 | Nakajima et al. | 6,020,745 A | 2/2000 | Taraci |
| 5,806,181 | A | 9/1998 | Khandros et al. | 6,023,103 A | 2/2000 | Chang et al. |
| 5,807,107 | A | 9/1998 | Bright et al. | 6,028,435 A | 2/2000 | Nikawa |
| 5,810,607 | A | 9/1998 | Shih et al. | 6,029,344 A | 2/2000 | Khandros et al. |
| 5,811,751 | A | 9/1998 | Leong et al. | 6,031,383 A | 2/2000 | Streib et al. |
| 5,811,982 | A | 9/1998 | Beaman et al. | 6,032,356 A | 3/2000 | Eldridge et al. |
| 5,813,847 | A | 9/1998 | Eroglu et al. | 6,032,714 A | 3/2000 | Fenton |
| 5,814,847 | A | 9/1998 | Shihadeh et al. | 6,033,935 A | 3/2000 | Dozier, II et al. |
| 5,820,014 | A | 10/1998 | Dozier, II et al. | 6,034,533 A | 3/2000 | Tervo et al. |
| 5,821,763 | A | 10/1998 | Beaman et al. | 6,037,785 A | 3/2000 | Higgins |
| 5,824,494 | A | 10/1998 | Feldberg | 6,042,712 A | 3/2000 | Mathieu |
| 5,829,128 | A | 11/1998 | Eldridge et al. | 6,043,563 A | 3/2000 | Eldridge et al. |
| 5,829,437 | A | 11/1998 | Bridges | 6,049,216 A | 4/2000 | Yang et al. |
| 5,831,442 | A | 11/1998 | Heigl | 6,049,976 A | 4/2000 | Khandros |
| 5,832,601 | A | 11/1998 | Eldridge et al. | 6,050,829 A | 4/2000 | Eldridge et al. |
| 5,833,601 | A | 11/1998 | Swartz et al. | 6,051,422 A | 4/2000 | Kovacs et al. |
| 5,838,160 | A | 11/1998 | Beaman et al. | 6,052,653 A | 4/2000 | Mazur et al. |
| 5,841,288 | A | 11/1998 | Meaney et al. | 6,054,651 A | 4/2000 | Fogel et al. |
| 5,846,708 | A | 12/1998 | Hollis et al. | 6,054,869 A | 4/2000 | Hutton et al. |
| 5,847,569 | A | 12/1998 | Ho et al. | 6,059,982 A | 5/2000 | Palagonia et al. |
| 5,848,500 | A | 12/1998 | Kirk | 6,060,888 A | 5/2000 | Blackham et al. |
| 5,852,232 | A | 12/1998 | Samsavar et al. | 6,060,892 A | 5/2000 | Yamagata |
| 5,854,608 | A | 12/1998 | Leisten | 6,061,589 A | 5/2000 | Bridges et al. |
| 5,864,946 | A | 2/1999 | Eldridge et al. | 6,062,879 A | 5/2000 | Beaman et al. |
| 5,867,073 | A | 2/1999 | Weinreb et al. | 6,064,213 A | 5/2000 | Khandros et al. |
| 5,869,326 | A | 2/1999 | Hofmann | 6,064,217 A | 5/2000 | Smith |
| 5,869,974 | A | 2/1999 | Akram et al. | 6,064,218 A | 5/2000 | Godfrey et al. |
| 5,874,361 | A | 2/1999 | Collins et al. | 6,066,911 A | 5/2000 | Lindemann et al. |
| 5,876,082 | A | 3/1999 | Kempf et al. | 6,078,183 A | 6/2000 | Cole, Jr. |
| 5,878,486 | A | 3/1999 | Eldridge et al. | 6,078,500 A | 6/2000 | Beaman et al. |
| 5,883,522 | A | 3/1999 | O'Boyle | 6,090,261 A | 7/2000 | Mathieu |
| 5,883,523 | A | 3/1999 | Ferland et al. | 6,091,236 A | 7/2000 | Piety et al. |
| 5,884,398 | A | 3/1999 | Eldridge et al. | 6,091,255 A | 7/2000 | Godfrey |
| 5,888,075 | A | 3/1999 | Hasegawa et al. | 6,096,567 A | 8/2000 | Kaplan et al. |
| 5,892,539 | A | 4/1999 | Colvin | 6,100,815 A | 8/2000 | Pailthorp |
| 5,896,038 | A | 4/1999 | Budnaitis et al. | 6,104,201 A | 8/2000 | Beaman et al. |
| 5,900,737 | A | 5/1999 | Graham et al. | 6,104,206 A | 8/2000 | Verkuil |
| 5,900,738 | A | 5/1999 | Khandros et al. | 6,110,823 A | 8/2000 | Eldridge et al. |
| 5,903,143 | A | 5/1999 | Mochizuki et al. | 6,114,864 A | 9/2000 | Soejima et al. |
| 5,905,421 | A | 5/1999 | Oldfield | 6,114,865 A | 9/2000 | Lagowski et al. |
| 5,910,727 | A | 6/1999 | Fujihara et al. | 6,118,287 A | 9/2000 | Boll et al. |
| 5,912,046 | A | 6/1999 | Eldridge et al. | 6,118,894 A | 9/2000 | Schwartz et al. |
| 5,914,613 | A | 6/1999 | Gleason et al. | 6,124,725 A | 9/2000 | Sato |
| 5,914,614 | A | 6/1999 | Beaman et al. | 6,127,831 A | 10/2000 | Khoury et al. |
| 5,916,689 | A | 6/1999 | Collins et al. | 6,137,302 A | 10/2000 | Schwindt |
| 5,917,707 | A | 6/1999 | Khandros et al. | 6,144,212 A | 11/2000 | Mizuta |
| 5,926,029 | A | 7/1999 | Ference et al. | 6,147,502 A | 11/2000 | Fryer et al. |

| | | |
|---|---|---|
| 6,147,851 A | 11/2000 | Anderson |
| 6,150,186 A | 11/2000 | Chen et al. |
| 6,160,407 A | 12/2000 | Nikawa |
| 6,160,412 A | 12/2000 | Martel et al. |
| 6,166,333 A | 12/2000 | Crumly et al. |
| 6,166,553 A | 12/2000 | Sinsheimer |
| 6,168,974 B1 | 1/2001 | Chang et al. |
| 6,169,410 B1 | 1/2001 | Grace et al. |
| 6,172,337 B1 | 1/2001 | Johnsgard et al. |
| 6,174,744 B1 | 1/2001 | Watanabe et al. |
| 6,175,228 B1 | 1/2001 | Zamborelli et al. |
| 6,176,091 B1 | 1/2001 | Kishi et al. |
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,206,273 B1 | 3/2001 | Beaman et al. |
| 6,208,225 B1 | 3/2001 | Miller |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathieu et al. |
| 6,256,882 B1 | 7/2001 | Gleason et al. |
| 6,257,564 B1 | 7/2001 | Avneri et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,387 B1 | 10/2001 | Gleason et al. |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,211 B2 | 6/2002 | Hamel et al. |
| 6,404,213 B2 | 6/2002 | Noda |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,419,500 B1 | 7/2002 | Kister |
| 6,420,722 B2 | 7/2002 | Moore et al. |
| 6,420,887 B1 | 7/2002 | Kister et al. |
| 6,424,164 B1 | 7/2002 | Kister |
| 6,424,316 B1 | 7/2002 | Leisten et al. |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge et al. |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,499,121 B1 | 12/2002 | Roy et al. |
| 6,501,343 B2 | 12/2002 | Miller |
| 6,509,751 B1 | 1/2003 | Mathieu |
| 6,512,482 B1 | 1/2003 | Nelson et al. |
| 6,520,778 B1 | 2/2003 | Eldridge et al. |
| 6,525,552 B2 | 2/2003 | Kister |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,530,148 B1 | 3/2003 | Kister |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,573,702 B2 | 6/2003 | Marcuse et al. |

| Patent No. | Date | Inventor |
|---|---|---|
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,586,956 B2 | 7/2003 | Aldaz et al. |
| 6,587,327 B1 | 7/2003 | Devoe et al. |
| 6,597,187 B2 | 7/2003 | Eldridge et al. |
| 6,603,322 B1 | 8/2003 | Boll et al. |
| 6,603,323 B1 | 8/2003 | Miller et al. |
| 6,603,324 B2 | 8/2003 | Eldridge et al. |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,386 B2 | 3/2004 | Gleason et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,764,869 B2 | 7/2004 | Eldridge |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller et al. |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,950 B2 | 9/2004 | Du Toit et al. |
| 6,798,225 B2 | 9/2004 | Miller |
| 6,798,226 B2 | 9/2004 | Altman et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,890 B2 | 1/2005 | Tervo et al. |
| 6,839,964 B2 | 1/2005 | Henson |
| 6,845,491 B2 | 1/2005 | Miller et al. |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,892,385 B2 | 5/2005 | Yoshida et al. |
| 6,900,646 B2 | 5/2005 | Kasukabe et al. |
| 6,900,647 B2 | 5/2005 | Mazur |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |
| 6,910,814 B2 | 6/2005 | Miller et al. |

| | | | | | | |
|---|---|---|---|---|---|---|
| 6,911,826 B2 | 6/2005 | Plotnikov et al. | 7,015,709 B2 | 3/2006 | Capps et al. | |
| 6,911,834 B2 | 6/2005 | Mitchell et al. | 7,015,710 B2 | 3/2006 | Yoshida et al. | |
| 6,911,835 B2 | 6/2005 | Chraft et al. | 7,015,711 B2 | 3/2006 | Rothaug et al. | |
| 6,912,468 B2 | 6/2005 | Marin et al. | 7,019,541 B2 | 3/2006 | Kittrell | |
| 6,913,468 B2 | 7/2005 | Dozier, II et al. | 7,019,544 B1 | 3/2006 | Jacobs et al. | |
| 6,914,244 B2 | 7/2005 | Alani | 7,019,701 B2 | 3/2006 | Ohno et al. | |
| 6,914,427 B2 | 7/2005 | Gifford et al. | 7,020,360 B2 | 3/2006 | Satomura et al. | |
| 6,914,430 B2 | 7/2005 | Hasegawa et al. | 7,020,363 B2 | 3/2006 | Johannessen | |
| 6,914,580 B2 | 7/2005 | Leisten | 7,022,976 B1 | 4/2006 | Santana, Jr. et al. | |
| 6,917,195 B2 | 7/2005 | Hollman | 7,022,985 B2 | 4/2006 | Knebel et al. | |
| 6,917,210 B2 | 7/2005 | Miller | 7,023,225 B2 | 4/2006 | Blackwood | |
| 6,917,211 B2 | 7/2005 | Yoshida et al. | 7,023,226 B2 | 4/2006 | Okumura et al. | |
| 6,917,525 B2 | 7/2005 | Mok et al. | 7,023,231 B2 | 4/2006 | Howland, Jr. et al. | |
| 6,917,732 B2 | 7/2005 | Miyata et al. | 7,025,628 B2 | 4/2006 | LaMeres et al. | |
| 6,919,732 B2 | 7/2005 | Yoshida et al. | 7,026,832 B2 | 4/2006 | Chaya et al. | |
| 6,922,069 B2 | 7/2005 | Jun | 7,026,833 B2 | 4/2006 | Rincon et al. | |
| 6,924,653 B2 | 8/2005 | Schaeffer et al. | 7,026,834 B2 | 4/2006 | Hwang | |
| 6,924,655 B2 | 8/2005 | Kirby | 7,026,835 B2 | 4/2006 | Farnworth et al. | |
| 6,927,078 B2 | 8/2005 | Saijyo et al. | 7,030,599 B2 | 4/2006 | Douglas | |
| 6,927,079 B1 | 8/2005 | Fyfield | 7,030,827 B2 | 4/2006 | Mahler et al. | |
| 6,927,586 B2 | 8/2005 | Thiessen | 7,032,307 B2 | 4/2006 | Matsunaga et al. | |
| 6,927,587 B2 | 8/2005 | Yoshioka | 7,034,553 B2 | 4/2006 | Gilboe | |
| 6,927,598 B2 | 8/2005 | Lee et al. | 7,035,738 B2 | 4/2006 | Matsumoto et al. | |
| 6,930,498 B2 | 8/2005 | Tervo et al. | 7,088,981 B2 | 8/2006 | Chang | |
| 6,933,713 B2 | 8/2005 | Cannon | 7,096,133 B1 | 8/2006 | Martin et al. | |
| 6,933,717 B1 | 8/2005 | Dogaru et al. | 7,148,711 B2 * | 12/2006 | Tervo et al. | 324/754 |
| 6,933,725 B2 | 8/2005 | Lim et al. | 7,187,188 B2 | 3/2007 | Andrews et al. | |
| 6,933,736 B2 | 8/2005 | Kobayashi et al. | 7,188,037 B2 | 3/2007 | Hidehira | |
| 6,933,737 B2 | 8/2005 | Sugawara | 7,368,927 B2 | 5/2008 | Smith et al. | |
| 6,937,020 B2 | 8/2005 | Munson et al. | 2001/0002794 A1 | 6/2001 | Draving et al. | |
| 6,937,037 B2 | 8/2005 | Eldridge et al. | 2001/0009061 A1 | 7/2001 | Gleason et al. | |
| 6,937,039 B2 | 8/2005 | Barr et al. | 2001/0009377 A1 | 7/2001 | Schwindt et al. | |
| 6,937,040 B2 | 8/2005 | Maeda et al. | 2001/0010468 A1 | 8/2001 | Gleason et al. | |
| 6,937,042 B2 | 8/2005 | Yoshida et al. | 2001/0020283 A1 | 9/2001 | Sakaguchi | |
| 6,937,045 B2 | 8/2005 | Sinclair | 2001/0024116 A1 | 9/2001 | Draving | |
| 6,937,341 B1 | 8/2005 | Woollam et al. | 2001/0030549 A1 * | 10/2001 | Gleason et al. | 324/758 |
| 6,940,264 B2 | 9/2005 | Ryken, Jr. et al. | 2001/0043073 A1 | 11/2001 | Montoya | |
| 6,940,283 B2 | 9/2005 | McQueeney | 2001/0044152 A1 | 11/2001 | Burnett | |
| 6,943,563 B2 | 9/2005 | Martens | 2001/0045511 A1 | 11/2001 | Moore et al. | |
| 6,943,571 B2 | 9/2005 | Worledge | 2001/0054906 A1 | 12/2001 | Fujimura | |
| 6,943,574 B2 | 9/2005 | Actmann et al. | 2002/0005728 A1 | 1/2002 | Babson et al. | |
| 6,944,380 B1 | 9/2005 | Hideo et al. | 2002/0008533 A1 | 1/2002 | Ito et al. | |
| 6,946,375 B2 | 9/2005 | Hattori et al. | 2002/0009377 A1 | 1/2002 | Shafer | |
| 6,946,859 B2 | 9/2005 | Karavakis et al. | 2002/0009378 A1 | 1/2002 | Obara | |
| 6,946,860 B2 | 9/2005 | Cheng | 2002/0011859 A1 | 1/2002 | Smith et al. | |
| 6,948,391 B2 | 9/2005 | Brassell et al. | 2002/0011863 A1 | 1/2002 | Takahashi et al. | |
| 6,948,981 B2 | 9/2005 | Pade | 2002/0050828 A1 | 5/2002 | Seward, IV et al. | |
| 6,970,001 B2 | 11/2005 | Chheda et al. | 2002/0070743 A1 | 6/2002 | Felici et al. | |
| 6,987,483 B2 | 1/2006 | Tran | 2002/0070745 A1 | 6/2002 | Johnson et al. | |
| 7,001,785 B1 | 2/2006 | Chen | 2002/0079911 A1 | 6/2002 | Schwindt | |
| 7,002,133 B2 | 2/2006 | Beausoleil et al. | 2002/0109514 A1 | 8/2002 | Brandorff et al. | |
| 7,002,363 B2 | 2/2006 | Mathieu | 2002/0118034 A1 | 8/2002 | Laureanti | |
| 7,002,364 B2 | 2/2006 | Kang et al. | 2002/0149377 A1 | 10/2002 | Hefti et al. | |
| 7,003,184 B2 | 2/2006 | Ronnekliev et al. | 2002/0153909 A1 | 10/2002 | Petersen et al. | |
| 7,005,842 B2 | 2/2006 | Fink et al. | 2002/0163769 A1 | 11/2002 | Brown | |
| 7,005,868 B2 | 2/2006 | McTigue | 2002/0168659 A1 | 11/2002 | Hefti et al. | |
| 7,005,879 B1 | 2/2006 | Robertazzi | 2002/0180466 A1 | 12/2002 | Hiramatsu et al. | |
| 7,006,046 B2 | 2/2006 | Aisenbrey | 2002/0197709 A1 | 12/2002 | van der Weide et al. | |
| 7,007,380 B2 | 3/2006 | Das et al. | 2003/0010877 A1 | 1/2003 | Landreville et al. | |
| 7,009,188 B2 | 3/2006 | Wang | 2003/0030822 A1 | 2/2003 | Finarov | |
| 7,009,383 B2 | 3/2006 | Harwood et al. | 2003/0032000 A1 | 2/2003 | Liu et al. | |
| 7,009,415 B2 | 3/2006 | Kobayashi et al. | 2003/0040004 A1 | 2/2003 | Hefti et al. | |
| 7,011,531 B2 | 3/2006 | Egitto et al. | 2003/0057513 A1 | 3/2003 | Leedy | |
| 7,012,425 B2 | 3/2006 | Shoji | 2003/0057957 A1 | 3/2003 | McQuade et al. | |
| 7,012,441 B2 | 3/2006 | Chou et al. | 2003/0062915 A1 | 4/2003 | Arnold et al. | |
| 7,013,221 B1 | 3/2006 | Friend et al. | 2003/0072549 A1 | 4/2003 | Facer et al. | |
| 7,014,499 B2 | 3/2006 | Yoon | 2003/0077649 A1 | 4/2003 | Cho et al. | |
| 7,015,455 B2 | 3/2006 | Mitsuoka et al. | 2003/0088180 A1 | 5/2003 | vanVeen et al. | |
| 7,015,689 B2 | 3/2006 | Kasajima et al. | 2003/0119057 A1 | 6/2003 | Gascoyne et al. | |
| 7,015,690 B2 | 3/2006 | Wang et al. | 2003/0139662 A1 | 7/2003 | Seidman | |
| 7,015,703 B2 | 3/2006 | Hopkins et al. | 2003/0139790 A1 | 7/2003 | Ingle et al. | |
| 7,015,707 B2 | 3/2006 | Cherian | 2003/0155939 A1 | 8/2003 | Lutz et al. | |
| 7,015,708 B2 | 3/2006 | Beckous et al. | 2003/0170898 A1 | 9/2003 | Gunderson et al. | |

| | | | | | | |
|---|---|---|---|---|---|---|
| 2003/0184332 | A1 | 10/2003 | Tomimatsu et al. | JP | 62-239050 | 10/1987 |
| 2004/0015060 | A1 | 1/2004 | Samsoondar et al. | JP | 62239050 | 10/1987 |
| 2004/0021475 | A1 | 2/2004 | Ito et al. | JP | 63-108736 | 5/1988 |
| 2004/0061514 | A1 | 4/2004 | Schwindt et al. | JP | 63-129640 | 6/1988 |
| 2004/0066181 | A1 | 4/2004 | Thies | JP | 63-143814 | 6/1988 |
| 2004/0069776 | A1 | 4/2004 | Fagrell et al. | JP | 63-318745 | 12/1988 |
| 2004/0090223 | A1 | 5/2004 | Yonezawa | JP | 1-165968 | 6/1989 |
| 2004/0095145 | A1 | 5/2004 | Boudiaf et al. | JP | 1-214038 | 8/1989 |
| 2004/0095641 | A1 | 5/2004 | Russum et al. | JP | 1-219575 | 9/1989 |
| 2004/0100276 | A1 | 5/2004 | Fanton | JP | 1-296167 | 11/1989 |
| 2004/0100297 | A1 | 5/2004 | Tanioka et al. | JP | 2-124469 | 5/1990 |
| 2004/0108847 | A1 | 6/2004 | Stoll et al. | JP | 2129393 | 5/1990 |
| 2004/0113640 | A1 | 6/2004 | Cooper et al. | JP | 2-22836 | 7/1990 |
| 2004/0124861 | A1 | 7/2004 | Zaerpoor | JP | 2-191352 | 7/1990 |
| 2004/0130787 | A1 | 7/2004 | Thome-Forster et al. | JP | 3-175367 | 7/1991 |
| 2004/0132222 | A1 | 7/2004 | Hembree et al. | JP | 3-196206 | 8/1991 |
| 2004/0134899 | A1 | 7/2004 | Hiramatsu et al. | JP | 3-228348 | 10/1991 |
| 2004/0147034 | A1 | 7/2004 | Gore et al. | JP | 4-1330639 | 5/1992 |
| 2004/0162689 | A1 | 8/2004 | Jamneala et al. | JP | 4-159043 | 6/1992 |
| 2004/0175294 | A1 | 9/2004 | Ellison et al. | JP | 4165361 | 6/1992 |
| 2004/0186382 | A1 | 9/2004 | Modell et al. | JP | 4-206930 | 7/1992 |
| 2004/0193382 | A1 | 9/2004 | Adamian et al. | JP | 4-340248 | 11/1992 |
| 2004/0197771 | A1 | 10/2004 | Powers et al. | JP | 5-082631 | 4/1993 |
| 2004/0199350 | A1 | 10/2004 | Blackham et al. | JP | 51-57790 | 6/1993 |
| 2004/0207072 | A1 | 10/2004 | Hiramatsu et al. | JP | 51-66893 | 7/1993 |
| 2004/0207424 | A1 | 10/2004 | Hollman | JP | 6-85044 | 3/1994 |
| 2004/0239338 | A1 | 12/2004 | Johnsson et al. | JP | 60-71425 | 3/1994 |
| 2004/0246004 | A1 | 12/2004 | Heuermann | JP | 6-102313 | 4/1994 |
| 2004/0251922 | A1 | 12/2004 | Martens et al. | JP | 6-132709 | 5/1994 |
| 2005/0024069 | A1 | 2/2005 | Hayden et al. | JP | 7-005078 | 1/1995 |
| 2005/0026276 | A1 | 2/2005 | Chou | JP | 7-12871 | 1/1995 |
| 2005/0030047 | A1 | 2/2005 | Adamian | JP | 7012871 | 1/1995 |
| 2005/0054029 | A1 | 3/2005 | Tomimatsu et al. | JP | 8-35987 | 2/1996 |
| 2005/0062533 | A1 | 3/2005 | Vice | JP | 8-261898 | 10/1996 |
| 2005/0083130 | A1 | 4/2005 | Grilo | JP | 8-330401 | 12/1996 |
| 2005/0101846 | A1 | 5/2005 | Fine et al. | JP | 10-116866 | 5/1998 |
| 2005/0156675 | A1 | 7/2005 | Rohde et al. | JP | 11-4001 | 1/1999 |
| 2005/0164160 | A1 | 7/2005 | Gunter et al. | JP | 11-023975 | 1/1999 |
| 2005/0165316 | A1 | 7/2005 | Lowery et al. | JP | 2000-329664 | 11/2000 |
| 2005/0168722 | A1 | 8/2005 | Forstner et al. | JP | 2001-124676 | 5/2001 |
| 2005/0174191 | A1 | 8/2005 | Brunker et al. | JP | 2001-189285 | 7/2001 |
| 2005/0178980 | A1 | 8/2005 | Skidmore et al. | JP | 2001-1893783 | 7/2001 |
| 2005/0195124 | A1 | 9/2005 | Puente Baliarda et al. | JP | 2002-203879 | 7/2002 |
| 2005/0236587 | A1 | 10/2005 | Kodama et al. | JP | 2002-243502 | 8/2002 |
| 2005/0237102 | A1 | 10/2005 | Tanaka | SU | 843040 | 6/1981 |
| 2006/0052075 | A1 | 3/2006 | Galivanche et al. | SU | 1392603 | 4/1988 |
| 2006/0155270 | A1 | 7/2006 | Hancock et al. | WO | PCT-WO98/07040 | 2/1998 |
| 2006/0226864 | A1 | 10/2006 | Kramer | WO | PCT-WO 00/73905 | 12/2000 |
| 2007/0024506 | A1 | 2/2007 | Hardacker | WO | PCT-WO01/07207 | 2/2001 |
| 2007/0030021 | A1 | 2/2007 | Cowan et al. | WO | WO 01/69656 | 9/2001 |
| | | | | WO | WO 2004/065944 | 8/2004 |
| | | | | WO | WO 2004/079299 | 9/2004 |
| | | | | WO | WO 2005/062025 | 7/2005 |

FOREIGN PATENT DOCUMENTS

| | | |
|---|---|---|
| DE | 3637549 | 5/1988 |
| DE | 4223658 | 1/1993 |
| DE | 19522774 | 1/1997 |
| DE | 10000324 | 7/2001 |
| EP | 0230348 | 7/1987 |
| EP | 0259163 | 3/1988 |
| EP | 0304868 | 3/1989 |
| EP | 0 945 736 | 9/1999 |
| EP | 0945736 | 9/1999 |
| JP | 53-037077 | 4/1978 |
| JP | 53-052354 | 5/1978 |
| JP | 55-115383 | 9/1980 |
| JP | 56-007439 | 1/1981 |
| JP | 56-88333 | 7/1981 |
| JP | 57-075480 | 5/1982 |
| JP | 57-163035 | 10/1982 |
| JP | 62-11243 | 1/1987 |
| JP | 62-51235 | 3/1987 |
| JP | 62-098634 | 5/1987 |
| JP | 62-107937 | 5/1987 |

OTHER PUBLICATIONS

Kim, Yong-Dae, et. al., "Fabrication of a Silicon Micro-Probe for Vertical Probe Card Application," Japanese Journal of Applied Physics, vol. 37, pp. 7070-7073, 1998.

Cascade Microtech, Inc., "Informaiton Sheet for Pyramid Probe," 5 pages, Copyright 2001.

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques, vol. 338, No. 7, Jul. 1990, pp. 858-863.

Leonard Hayden, "A Multi-Line TRL Calibration," Feb. 2, 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Roberto Tinti, Franz Sischka, and Chris Morton, "Proposed System Solution for l/f Noise Parameter Extraction," Agilent Technologies Comms EDA, 1400 Fountaingrove Pkw, Santa Rosa, Ca 95403, 7 pages.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Institute of Physics, pp. 1354-1356.

Cascade Microtech, "Probe Heads Care and cleaning of coaxial input microwave probes," Microwave Probe Care and Cleaning, Instruction Manual, Copyright 1990.

* cited by examiner

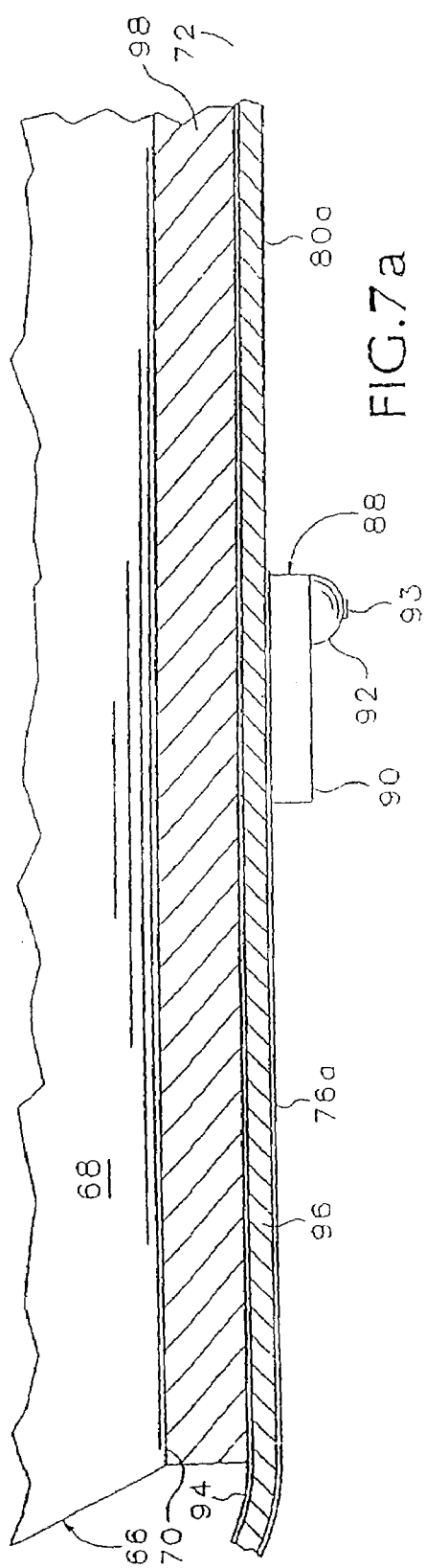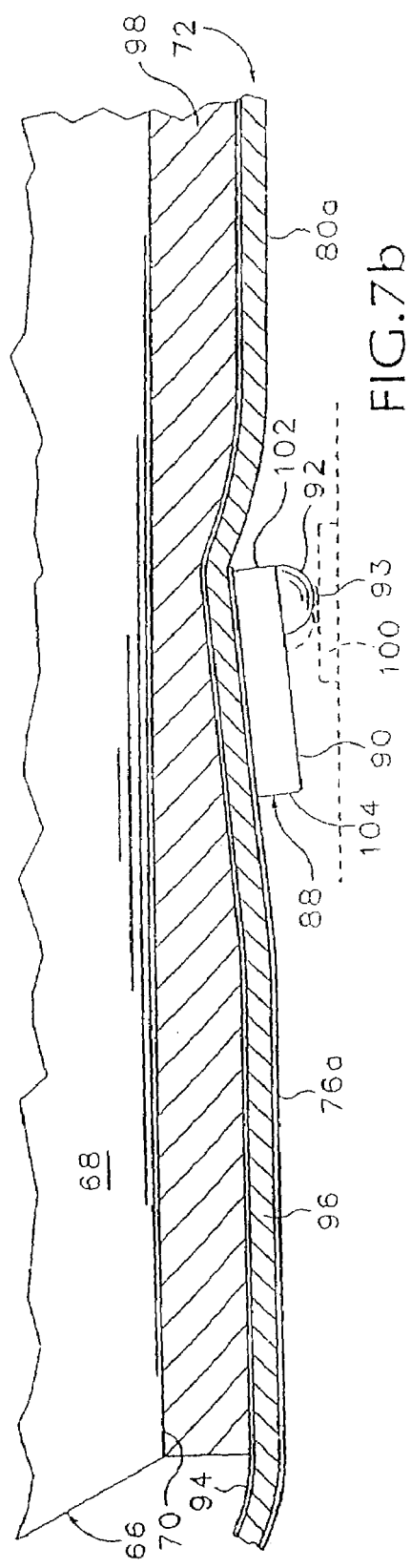

MEMBRANE PROBING SYSTEM

CROSS-REFERENCE TO RELATED APPLICATIONS

This application is a continuation of U.S. patent application Ser. No. 10/223,863, filed Aug. 19, 2002, now U.S. Pat. No. 7,355,420; which application claims the benefit of U.S. Provisional App. No. 60/314,155, filed Aug. 21, 2001.

BACKGROUND OF THE INVENTION

The present invention relates to probe assemblies of the type commonly used for testing integrated circuits (IC).

The trend in electronic production has been toward increasingly smaller geometries particularly in integrated circuit technology wherein a very large number of discrete circuit elements are fabricated on a single substrate or "wafer." After fabrication, this wafer is divided into a number of rectangular-shaped chips or "dice" where each die presents a rectangular or other regular arrangement of metallized contact pads through which input/output connections are made. Although each die is eventually packaged separately, for efficiency sake, testing of the circuit formed on each die is preferably performed while the dies are still joined together on the wafer. One typical procedure is to support the wafer on a flat stage or "chuck" and to move the wafer in X, Y and Z directions relative to the head of the probing assembly so that the contacts on the probing assembly move from die to die for consecutive engagement with each die. Respective signal, power and ground lines are run to the probing assembly from the test instrumentation thus enabling each circuit to be sequentially connected to the test instrumentation.

One conventional type of probing assembly used for testing integrated circuits provides contacts that are configured as needle-like tips. These tips are mounted about a central opening formed in a probe card so as to radially converge inwardly and downwardly through the opening. When the wafer is raised beyond that point where the pads on the wafer first come into contact with these tips, the tips flex upwardly so as to skate forwardly across their respective pads thereby removing oxide buildup on the pads.

The problem with this type of probing assembly is that the needle-like tips, due to their narrow geometry, exhibit high inductance so that signal distortion is large in high frequency measurements made through these tips. Also, these tips can act in the manner of a planing tool as they wipe across their respective pads, thereby leading to excessive pad damage. This problem is magnified to the extent that the probe tips bend out of shape during use or otherwise fail to terminate in a common plane which causes the more forward ones of the tips to bear down too heavily on their respective pads. Also, it is impractical to mount these tips at less than 100 micron center-to-center spacing or in a multi-row grid-like pattern so as to accommodate the pad arrangement of more modern, higher density dies. Also, this type of probing assembly has a scrub length of the needle tips of 25 microns or more, which increases the difficulty of staying within the allowed probing area.

In order to reduce inductive losses, decrease pad wear, and accommodate smaller device geometries, a second type of probing assembly has been developed that uses a flexible membrane structure for supporting the probing contacts. In this assembly, lead lines of well-defined geometry are formed on one or more plies of flexible insulative film, such as polyimide or MYLAR™. If separate plies are used, these plies are bonded together to form, for example, a multilayered transmission line structure. In the central portion of this flexible structure or membrane, each conductive line is terminated by a respective probing contact which is formed on, and projects outwardly from; an outer face of the membrane. These probing contacts are arranged in a predetermined pattern that matches the pattern of the device pads and typically are formed as upraised bumps for probing the flat surfaces conventionally defined by the pads. The inner face of the membrane is supported on a supporting structure. This structure can take the form, for example, of a truncated pyramid, in which case the inner face of the center portion of the membrane is supported on the truncated end of the support while the marginal portions of the membrane are drawn away from the center portion at an angle thereto so as to clear any upright components that may surround the pads on the device.

With respect to the membrane probing assembly just described, excessive line inductance is eliminated by carefully selecting the geometry of the lead lines, and a photolithographic process is preferably used to enable some control over the size, spacing, and arrangement, of the probing contacts so as to accommodate higher density configurations. However, although several different forms of this probing assembly have been proposed, difficulties have been encountered in connection with this type of assembly in reducing pad wear and in achieving reliable clearing of the oxide layer from each of the device pads so as to ensure adequate electrical connection between the assembly and the device-under-test.

One conventional form of membrane probing assembly, for example, is exemplified by the device shown in Rath European Patent Pub. No. 259,163A2. This device has the central portion of the sheet-like membrane mounted directly against a rigid support. This rigid support, in turn, is connected by a resilient member comprising an elastomeric or rubber block to the main body of the assembly so that the membrane can tilt to match the tilt of the device. Huff U.S. Pat. No. 4,918,383 shows a closely related device wherein radially extending leaf springs permit vertical axis movement of the rigid support while preventing it from tilting so that there is no slippage or "misalignment" of the contact bumps on the pads and further so that the entire membrane will shift slightly in the horizontal plane to allow the contacts to "scrub" across their respective pads in order to clear surface oxides from these pads.

In respect to both of these devices, however; because of manufacturing tolerances; certain of the contact bumps are likely to be in a recessed position relative to their neighbors and these recessed bumps will not have a satisfactory opportunity to engage their pads since they will be drawn away from their pads by the action of their neighbors on the rigid support. Furthermore, even when "scrub" movement is provided in the manner of Huff, the contacts will tend to frictionally cling to the device as they perform the scrubbing movement, that is, there will be a tendency for the pads of the device to move in unison with the contacts so as to negate the effect of the contact movement. Whether any scrubbing action actually occurs depends on how far the pads can move, which depends, in turn, on the degree of lateral play that exists as a result of normal tolerance between the respective bearing surfaces of the probe head and chuck. Hence this form of membrane probing assembly does not ensure reliable electrical connection between each contact and pad.

A second conventional form of membrane probing assembly is exemplified by the device shown in Barsotti European Patent Pub. No. 304,868A2. This device provides a flexible backing for the central or contact-carrying portion of the flexible membrane. In Barsotti, the membrane is directly backed by an elastomeric member and this member, in turn, is backed by a rigid support so that minor height variations between the contacts or pads can be accommodated. It is also possible to use positive-pressure air, negative-pressure air, liquid or an unbacked elastomer to provide flexible backing for the membrane, as shown in Gangroth U.S. Pat. No. 4,649, 339, Ardezzone U.S. Pat. No. 4,636,772, Reed, Jr. et al. U.S. Pat. No. 3,596,228 and Okubo et al. U.S. Pat. No. 5,134,365, respectively. These alternative devices, however, do not afford sufficient pressure between the probing contacts and the device pads to reliably penetrate the oxides that form on the pad surfaces.

In this second form of membrane probing assembly, as indicated in Okubo, the contacts may be limited to movement along the Z-axis in order to prevent slippage and resulting misalignment between the contacts and pads during engagement. Thus, in Barsotti, the rigid support underlying the elastomeric member is fixed in position although it is also possible to mount the support for Z-axis movement in the manner shown in Huff U.S. Pat. No. 4,980,637. Pad damage is likely to occur with this type of design, however, because a certain amount of tilt is typically present between the contacts and the device, and those contacts angled closest to the device will ordinarily develop much higher contact pressures than those which are angled away. The same problem arises with the related assembly shown in European Patent Pub. No. 230, 348A2 to Garretson, even though in the Garretson device the characteristic of the elastomeric member is such as to urge the contacts into lateral movement when those contacts are placed into pressing engagement with their pads. Yet another related assembly is shown in Evans U.S. Pat. No. 4,975,638 which uses a pivotably mounted support for backing the elastomeric member so as to accommodate tilt between the contacts and the device. However, the Evans device is subject to the friction clinging problem already described insofar as the pads of the device are likely to cling to the contacts as the support pivots and causes the contacts to shift laterally.

Yet other forms of conventional membrane probing assemblies are shown in Crumly U.S. Pat. No. 5,395,253, Barsotti et al. U.S. Pat. No. 5,059,898 and Evans et al. U.S. Pat. No. 4,975,638. In Crumly, the center portion of a stretchable membrane is resiliently biased to a fully stretched condition using a spring. When the contacts engage their respective pads, the stretched center portion retracts against the spring to a partially relaxed condition so as to draw the contacts in radial scrub directions toward the center of the membrane. In Barsotti, each row of contacts is supported by the end of a respective L-shaped arm so that when the contacts in a row engage their respective pads, the corresponding arm flexes upwardly and causes the row of contacts to laterally scrub simultaneously across their respective pads. In both Crumly and Barsotti, however, if any tilt is present between the contacts and the device at the time of engagement, this tilt will cause the contacts angled closest to the device to scrub further than those angled further away. Moreover, the shorter contacts will be forced to move in their scrub directions before they have had the opportunity to engage their respective pads due to the controlling scrub action of their neighboring contacts. A further disadvantage of the Crumly device, in particular, is that the contacts nearer to the center of the membrane will scrub less than those nearer to the periphery so that scrub effectiveness will vary with contact position.

In Evans et al. U.S. Pat. No. 5,355,079 each contact constitutes a spring metal finger, and each finger is mounted so as to extend in a cantilevered manner away from the underlying membrane at a predetermined angle relative to the membrane. A similar configuration is shown in Higgins U.S. Pat. No. 5,521,518. It is difficult, however, to originally position these fingers so that they all terminate in a common plane, particularly if a high density pattern is required. Moreover, these fingers are easily bent out of position during use and cannot easily be rebent back to their original position. Hence, certain ones of the fingers are likely to touch down before other ones of the fingers, and scrub pressures and distances are likely to be different for different fingers. Nor, in Evans at least, is there an adequate mechanism for tolerating a minor degree of tilt between the fingers and pads. Although Evans suggests roughening the surface of each finger to improve the quality of electrical connection, this roughening can cause undue abrasion and damage to the pad surfaces. Yet a further disadvantage of the contact fingers shown in both Evans and Higgins is that such fingers are subject to fatigue and failure after a relatively low number of "touchdowns" or duty cycles due to repeated bending and stressing.

Referring to FIG. 1, Cascade Microtech, Inc. of Beaverton, Oreg. has developed a probe head 40 for mounting a membrane probing assembly 42. In order to measure the electrical performance of a particular die area 44 included on the silicon wafer 46, the high-speed digital lines 48 and/or shielded transmission lines 50 of the probe head are connected to the input/output ports of the test instrumentation by a suitable cable assembly, and the chuck 51 which supports the wafer is moved in mutually perpendicular X,Y,Z directions in order to bring the pads of the die area into pressing engagement with the contacts included on the lower contacting portion of the membrane probing assembly.

The probe head 40 includes a probe card 52 on which the data/signal lines 48 and 50 are arranged. Referring to FIGS. 2-3, the membrane probing assembly 42 includes a support element 54 formed of incompressible material such as a hard polymer. This element is detachably connected to the upper side of the probe card by four Allen screws 56 and corresponding nuts 58 (each screw passes through a respective attachment arm 60 of the support element, and a separate backing element 62 evenly distributes the clamping pressure of the screws over the entire back side of the supporting element). In accordance with this detachable connection, different probing assemblies having different contact arrangements can be quickly substituted for each other as needed for probing different devices.

Referring to FIGS. 3-4, the support element 54 includes a rearward base portion 64 to which the attachment arms 60 are integrally joined. Also included on the support element 54 is a forward support or plunger 66 that projects outwardly from the flat base portion. This forward support has angled sides 68 that converge toward a flat support surface 70 so as to give the forward support the shape of a truncated pyramid. Referring also to FIG. 2, a flexible membrane assembly 72 is attached to the support after being aligned by means of alignment pins 74 included on the base portion. This flexible membrane assembly is formed by one or more plies of insulative sheeting such as KAPTON™ sold by E.I. Du Pont de Nemours or other polyimide film, and flexible conductive layers or strips are provided between or on these plies to form the data/signal lines 76.

When the support element 54 is mounted on the upper side of the probe card 52 as shown in FIG. 3, the forward support 66 protrudes through a central opening 78 in the probe card so as to present the contacts which are arranged on a central region 80 of the flexible membrane assembly in suitable position for pressing engagement with the pads of the device under test. Referring to FIG. 2, the membrane assembly includes radially extending arm segments 82 that are separated by inwardly curving edges 84 that give the assembly the shape of a formee cross, and these segments extend in an inclined manner along the angled sides 68 thereby clearing any upright components surrounding the pads. A series of contact pads 86 terminate the data/signal lines 76 so that when the support element is mounted, these pads electrically engage corresponding termination pads provided on the upper side of the probe card so that the data/signal lines 48 on the probe card are electrically connected to the contacts on the central region.

A feature of the probing assembly 42 is its capability for probing a somewhat dense arrangement of contact pads over a large number of contact cycles in a manner that provides generally reliable electrical connection between the contacts and pads in each cycle despite oxide buildup on the pads. This capability is a function of the construction of the support element 54, the flexible membrane assembly 72 and their manner of interconnection. In particular, the membrane assembly is so constructed and connected to the support element that the contacts on the membrane assembly preferably wipe or scrub, in a locally controlled manner, laterally across the pads when brought into pressing engagement with these pads. The preferred mechanism for producing this scrubbing action is described in connection with the construction and interconnection of a preferred membrane assembly 72a as best depicted in FIGS. 6 and 7a-7b.

FIG. 6 shows an enlarged view of the central region 80a of the membrane assembly 72a. In this embodiment, the contacts 88 are arranged in a square-like pattern suitable for engagement with a square-like arrangement of pads. Referring also to FIG. 7a, which represents a sectional view taken along lines 7a-7a in FIG. 6, each contact comprises a relatively thick rigid beam 90 at one end of which is formed a rigid contact bump 92. The contact bump includes thereon a contacting portion 93 which comprises a nub of rhodium fused to the contact bump. Using electroplating, each beam is formed in an overlapping connection with the end of a flexible conductive trace 76a to form a joint therewith. This conductive trace in conjunction with a back-plane conductive layer 94 effectively provides a controlled impedance data/signal line to the contact because its dimensions are established using a photolithographic process. The backplane layer preferably includes openings therein to assist, for example, with gas venting during fabrication.

The membrane assembly is interconnected to the flat support surface 70 by an interposed elastomeric layer 98, which layer is coextensive with the support surface and can be formed by a silicone rubber compound such as ELMER'S STICK-ALL™ made by the Borden Company or Sylgard 182 by Dow Corning Corporation. This compound can be conveniently applied in a paste-like phase which hardens as it sets. The flat support surface, as previously mentioned, is made of incompressible material and is preferably a hard dielectric such as polysulfone or glass.

In accordance with the above-described construction, when one of the contacts 88 is brought into pressing engagement with a respective pad 100, as indicated in FIG. 7b, the resulting off-center force on the rigid beam 90 and bump 92 structure causes the beam to pivot or tilt against the elastic recovery force provided by the elastomeric pad 98. This tilting motion is localized in the sense that a forward portion 102 of the beam moves a greater distance toward the flat support surface 70 than a rearward portion 104 of the same beam. The effect is such as to drive the contact into lateral scrubbing movement across the pad as is indicated in FIG. 7b with a dashed-line and solid-line representation showing the beginning and ending positions, respectively, of the contact on the pad. In this fashion, the insulative oxide buildup on each pad is removed so as to ensure adequate contact-to-pad electrical connections.

FIG. 8 shows, in dashed line view, the relative positions of the contact 88 and pad 100 at the moment of initial engagement or touchdown and, in solid-line view, these same elements after "overtravel" of the pad by a distance 106 in a vertical direction directly toward the flat support surface 70. As indicated, the distance 108 of lateral scrubbing movement is directly dependent on the vertical deflection of the contact 88 or, equivalently, on the overtravel distance 106 moved by the pad 100. Hence, since the overtravel distance for each contact on the central region 80a will be substantially the same (with differences arising from variations in contact height), the distance of lateral scrubbing movement by each contact on the central region will be substantially uniform and will not, in particular, be affected by the relative position of each contact on the central region.

Because the elastomeric layer 98 is backed by the incompressible support surface 70, the elastomeric layer exerts a recovery force on each tilting beam 90 and thus each contact 93 to maintain contact-to-pad pressure during scrubbing. At the same time, the elastomeric layer accommodates some height variations between the respective contacts. Thus, referring to FIG. 9a, when a relatively shorter contact 88a is situated between an immediately adjacent pair of relatively taller contacts 88b and these taller contacts are brought into engagement with their respective pads, then, as indicated in FIG. 9b, deformation by the elastomeric layer allows the smaller contact to be brought into engagement with its pad after some further overtravel by the pads. It will be noted, in this example, that the tilting action of each contact is locally controlled, and the larger contacts are able, in particular, to tilt independently of the smaller contact so that the smaller contact is not urged into lateral movement until it has actually touched down on its pad.

Referring to FIGS. 10 and 11, the electroplating process to construct such a beam structure, as schematically shown in FIG. 8, includes the incompressible material 68 defining the support surface 70 and the substrate material attached thereon, such as the elastomeric layer 98. Using a flex circuit construction technique, the flexible conductive trace 76a is then patterned on a sacrificial substrate. Next, a polyimide layer 77 is patterned to cover the entire surface of the sacrificial substrate and of the traces 76a, except for the desired location of the beams 90 on a portion of the traces 76a. The beams 90 are then electroplated within the openings in the polyimide layer 77. Thereafter, a layer of photoresist 79 is patterned on both the surface of the polyimide 77 and beams 90 to leave openings for the desired location of the contact bumps 92. The contact bumps 92 are then electroplated within the openings in the photoresist layer 79. The photoresist layer 79 is removed and a thicker photoresist layer 81 is patterned to cover the exposed surfaces, except for the desired locations for the contacting portions 93. The contacting portions 93 are then electroplated within the openings in the photoresist layer 81. The photoresist layer 81 is then removed. The sacrificial substrate layer is removed and the remaining layers are attached to the elastomeric layer 98. The resulting beams 90, contact bumps 92, and contacting portions 93, as more accurately, illustrated in FIG. 12, provides the independent tilting and scrubbing functions of the device.

Another suitable technique of the construction of a membrane probe is disclosed in co-pending U.S. patent application Ser. No. 09/115,571, incorporated by reference herein. However, for the inventions described herein, the present inventors have no preference as to the particular construction of the contacting portion of the membrane assembly nor the general structure of the membrane or membrane assembly itself.

While providing an improved technique for effective scrubbing action is significant, the present inventors determined that excessive noise still remains in the signals sensed by the measurement device.

BRIEF SUMMARY OF THE INVENTION

The present invention overcomes the aforementioned drawbacks of the prior art by providing a membrane probing assembly with a probe card that includes conductors supported thereon, wherein the conductors include at least a signal conductor located between a pair of spaced apart guard conductors. A membrane assembly includes a membrane with contacts thereon, and supporting at least a signal conductor located between a pair of spaced apart guard conductors. The guard conductors of the probe card are electrically interconnected proximate the interconnection between the probe card and the membrane assembly. The guard conductors of the membrane assembly are electrically interconnected proximate the interconnection between the probe card and the membrane assembly.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIGS. 7a-7b are sectional views taken along lines 7a-7a in FIG. 6 first showing a contact before touchdown and then showing the same contact after touchdown and scrub movement across its respective pad.

DETAILED DESCRIPTION OF PREFERRED EMBODIMENT

With particular regard to probe cards that are specially adapted for use in measuring ultra-low currents, probe card designers have been concerned with developing techniques for controlling (e.g., minimizing) leakage currents. Unwanted currents that flow into a particular cable (or conductor) from surrounding cables (or conductors) may distort the current measured in that particular cable (or conductor). For a given potential difference between two spaced apart conductors, the amount of leakage current that will flow between them will vary depending upon the volume resistivity of the insulating material that separates the conductors. In other words, if a relatively lower-resistance insulator is used, this will result in a relatively higher leakage current. Thus, a designer of low-current probe cards will normally avoid the use of rubber-insulated single-core wires on a glass-epoxy board since rubber and glass-epoxy materials are known to be relatively low-resistance insulators through which relatively large leakage currents can flow.

One technique that has been used for suppressing interchannel leakage currents is positioning the signal conductor between a pair of guard conductors, where each guard conductor is maintained at the same potential as the signal conductor by a feedback circuit in the output channel of the test instrument. Because the voltage potentials of the guard conductors and the respective signal conductor are made to substantially track each other, negligible leakage current will flow from the signal conductor to the corresponding guard conductors. Although leakage current can still flow between different sets of guard conductors, this is typically not a problem because the guard conductors, unlike the signal conductors, are at low impedance. By using this guarding technique, significant improvements may be realized in the low-level current measuring capability of certain probe card designs by reducing the capacitance between signal and guard, and increasing the resistance between signal and guard.

Figure 1:
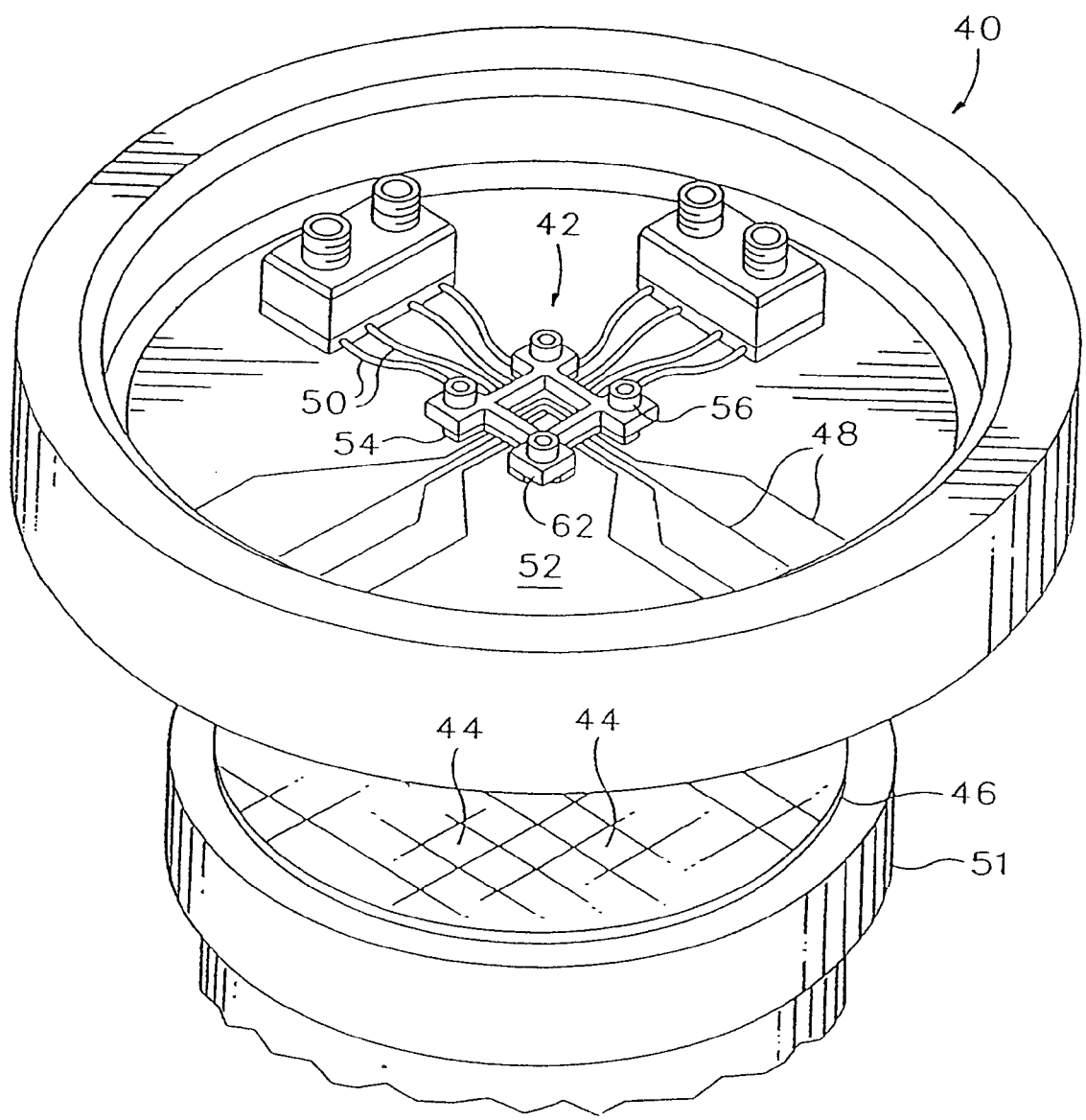
FIG. 1 is a perspective view of a membrane probing assembly bolted to a probe head and a wafer supported on a chuck in suitable position for probing by this assembly.
Figure 2:
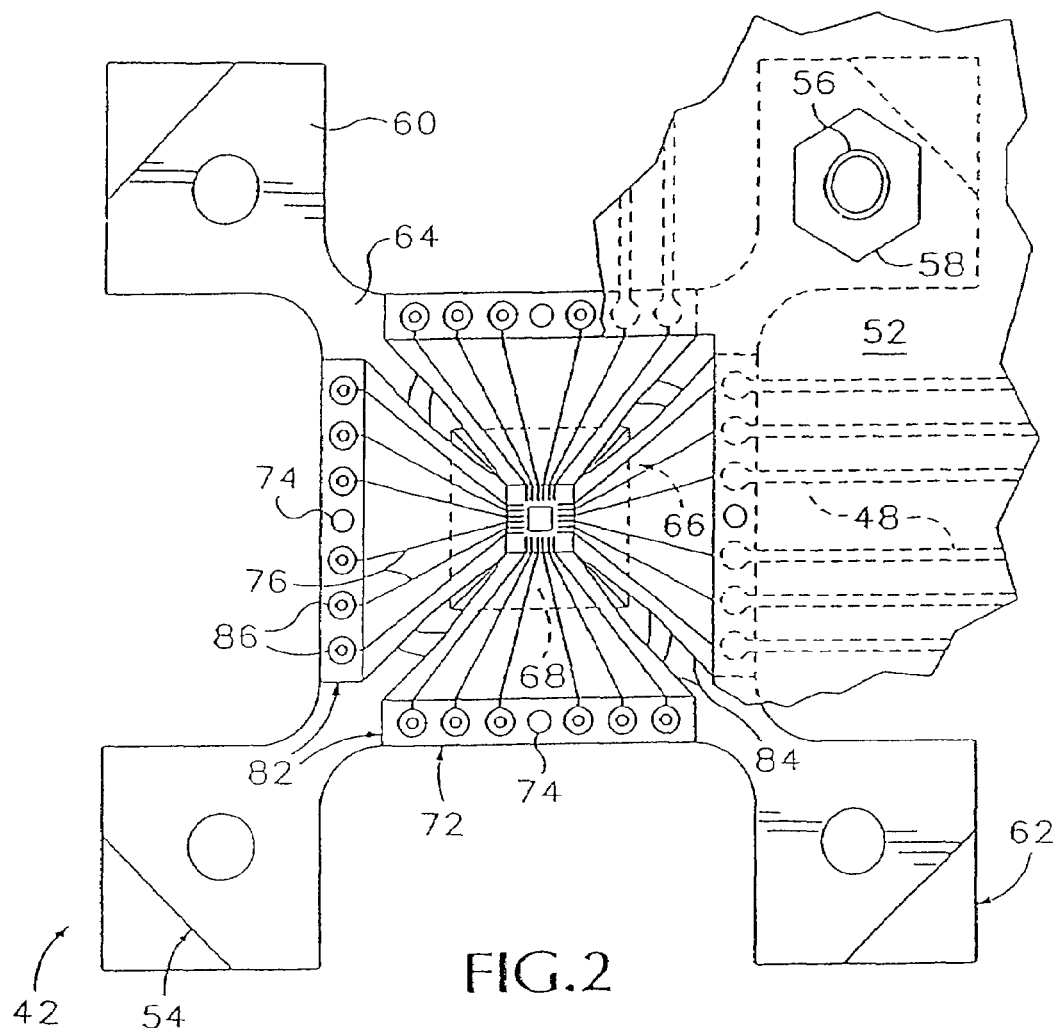
FIG. 2 is a bottom elevational view showing various parts of the probing assembly of FIG. 1, including a support element and flexible membrane assembly, and a fragmentary view of a probe card having data/signal lines connected with corresponding lines on the membrane assembly.
Figure 3:
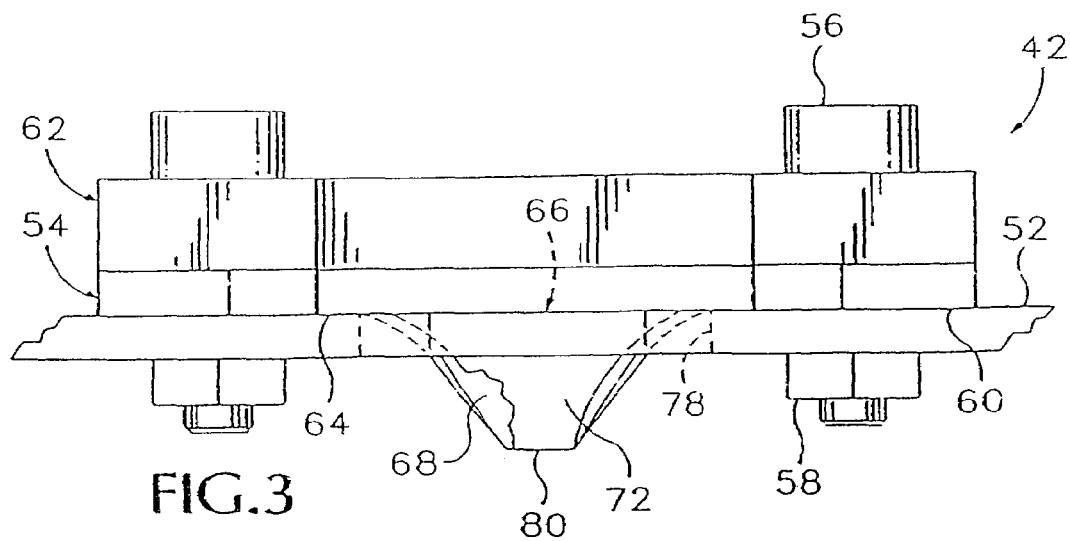
FIG. 3 is a side elevational view of the membrane probing assembly of FIG. 1 where a portion of the membrane assembly has been cut away to expose hidden portions of the support element.
Figure 4:
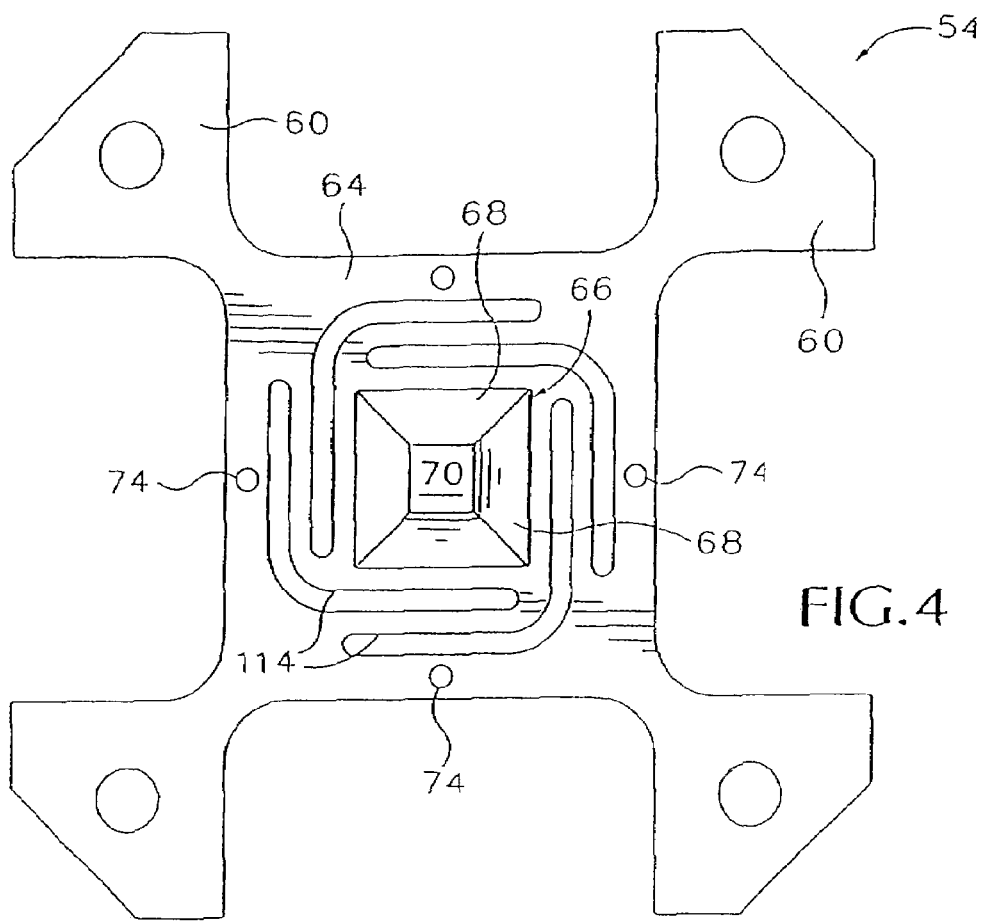
FIG. 4 is a top elevational view of an exemplary support element.
Figure 5A:
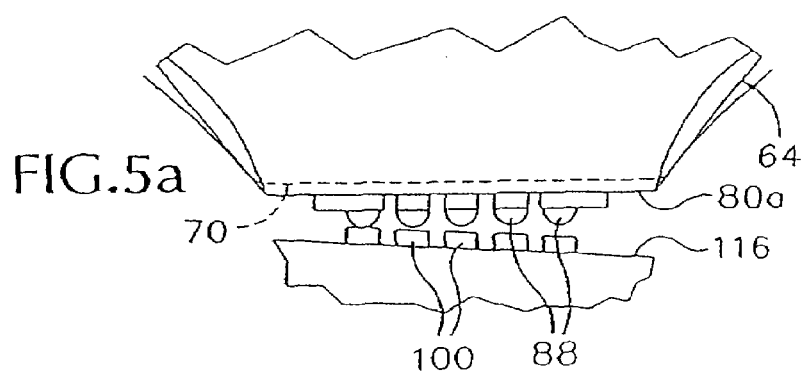
FIGS. 5a-5b are schematic side elevational views illustrating how the support element and membrane assembly are capable of tilting to match the orientation of the device under test.
Figure 5B:
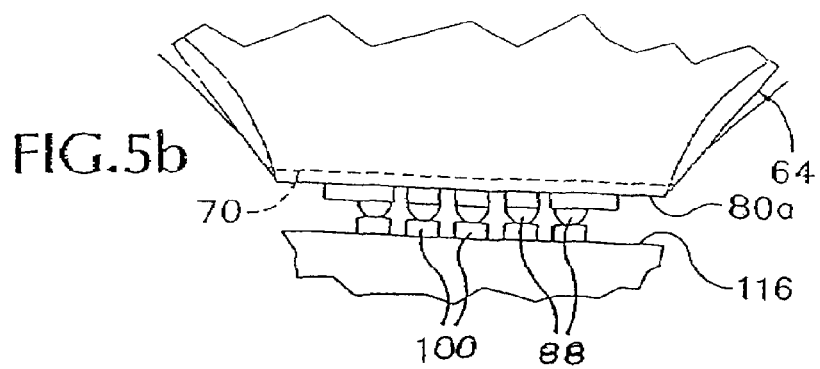
Figure 6:
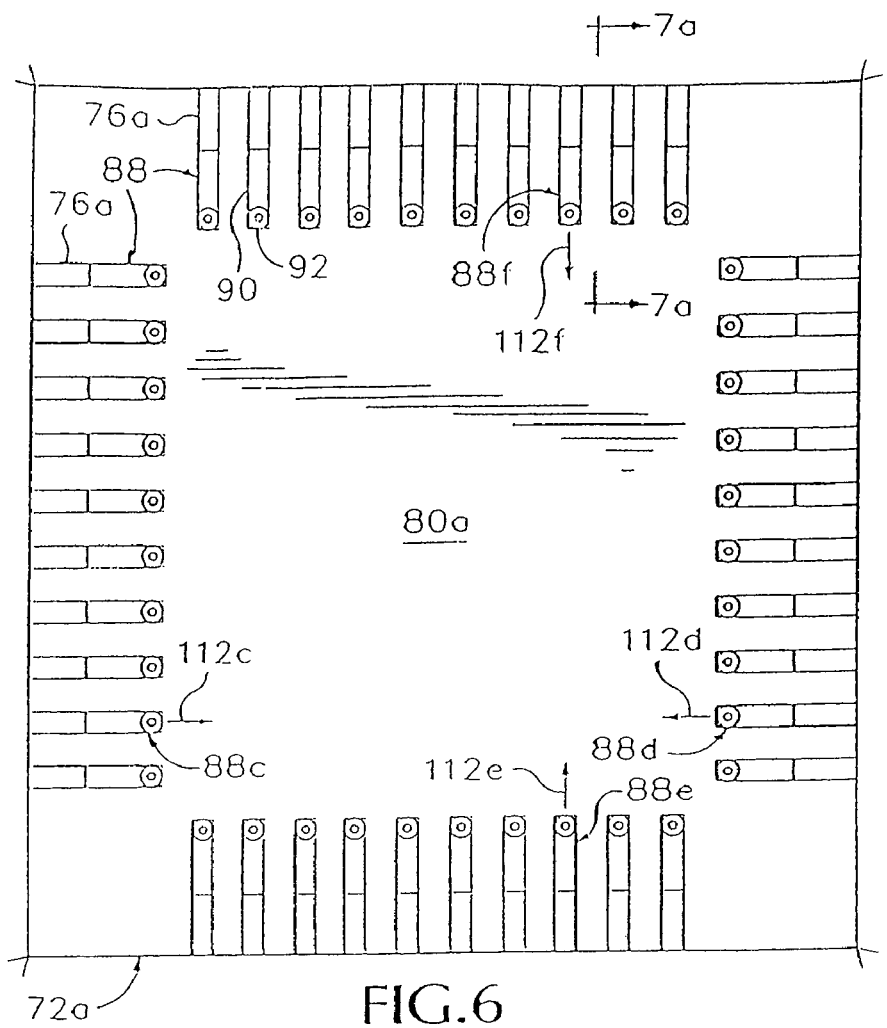
FIG. 6 is an enlarged top elevational view of the central region of the construction of the membrane assembly of FIG. 2.
Figure 8:
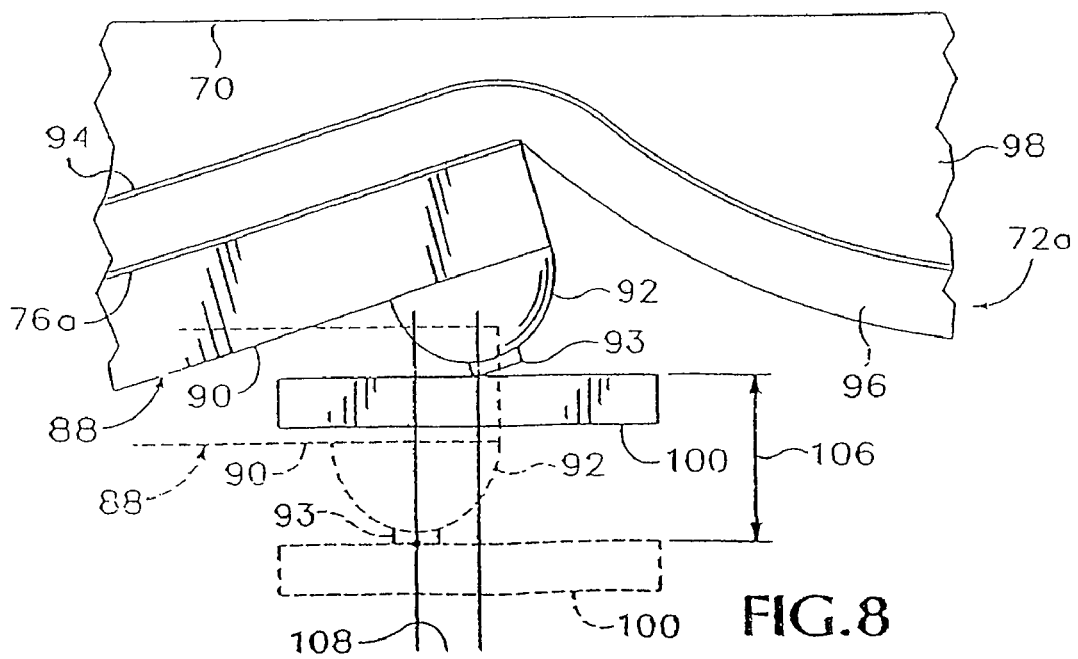
FIG. 8 is a schematic side view showing, in dashed-line representation, the contact of FIGS. 7a-7b at the moment of initial touchdown and, in solid-line representation, the same contact after further vertical overtravel by the pad.
Figure 9A:
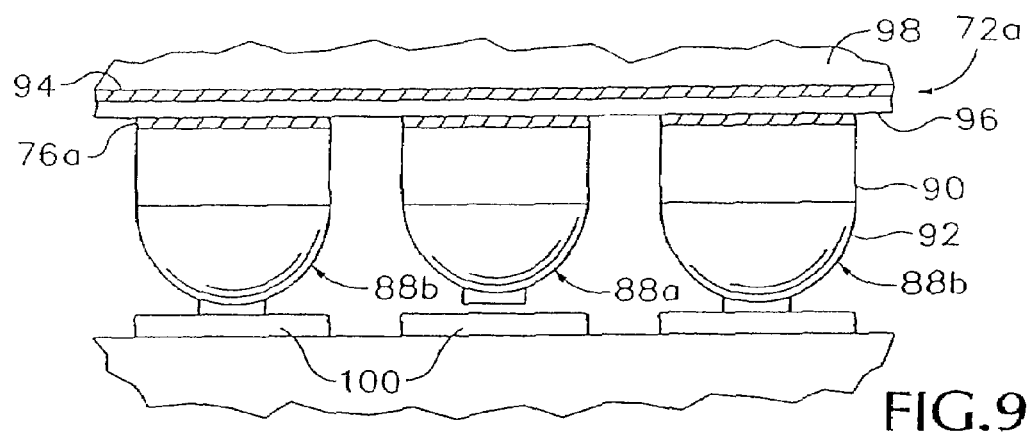
FIGS. 9a and 9b illustrate the deformation of the elastomeric layer to bring the contacts into contact with its pad.
Figure 9B:
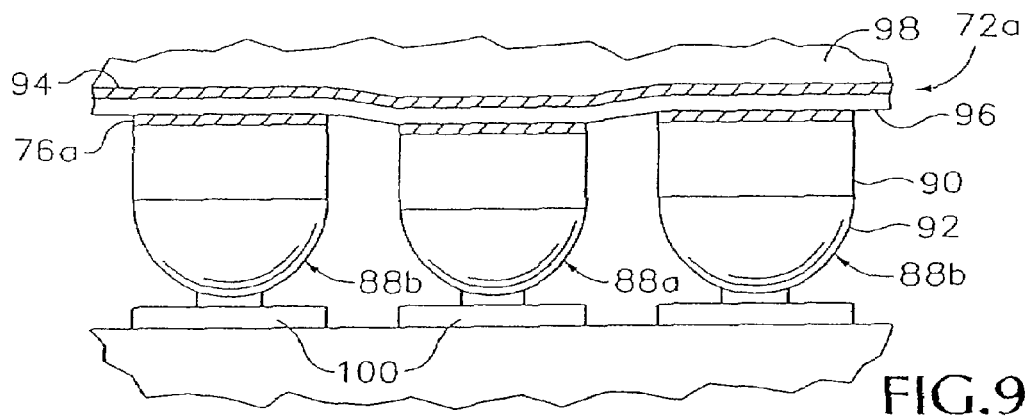
Figure 10:
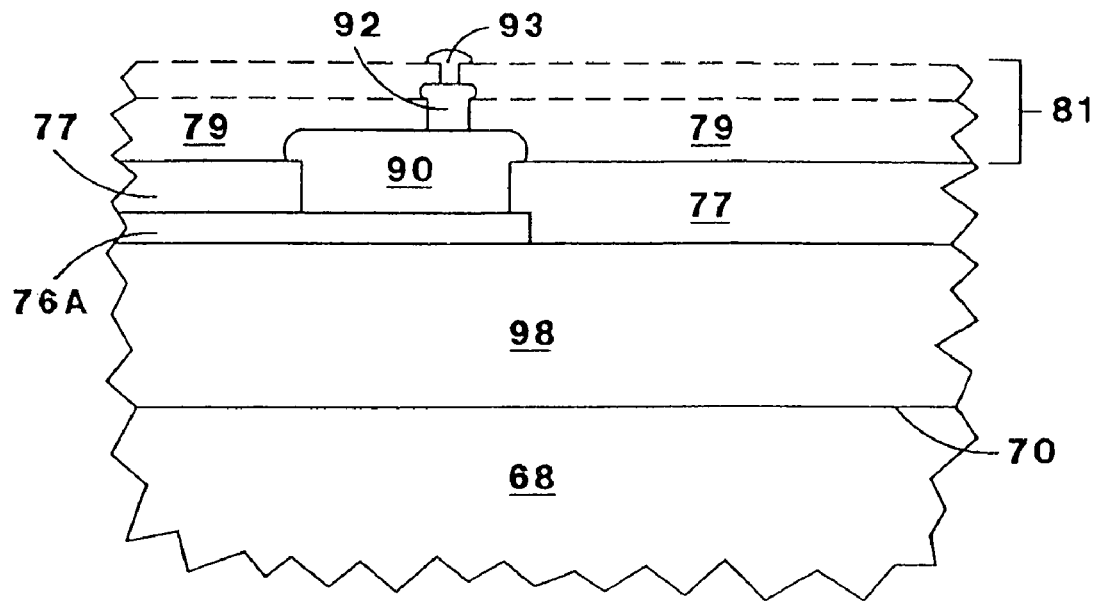
FIG. 10 is a longitudinal sectional view of the device of FIG. 8.
Figure 11:
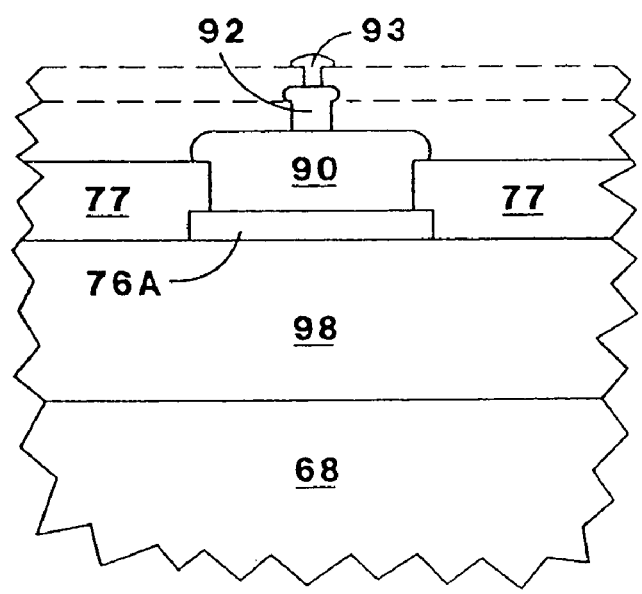
FIG. 11 is a cross sectional view of the device of FIG. 8.
Figure 12:
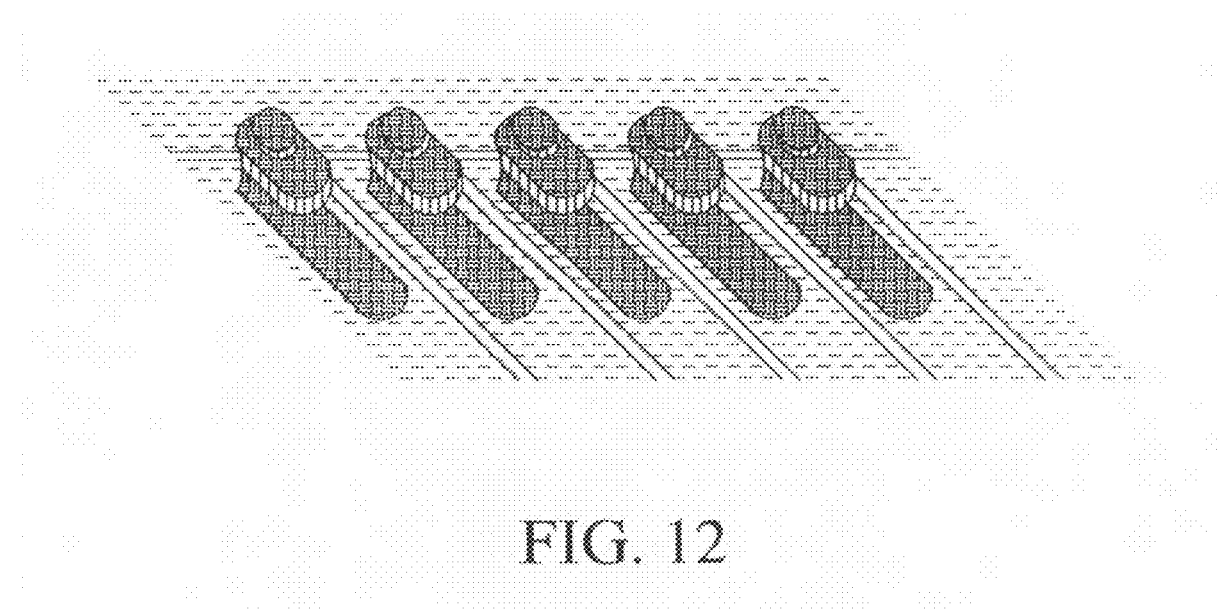
FIG. 12 is a more accurate pictorial view of the device shown in FIGS. 10 and 11.
Figure 13:
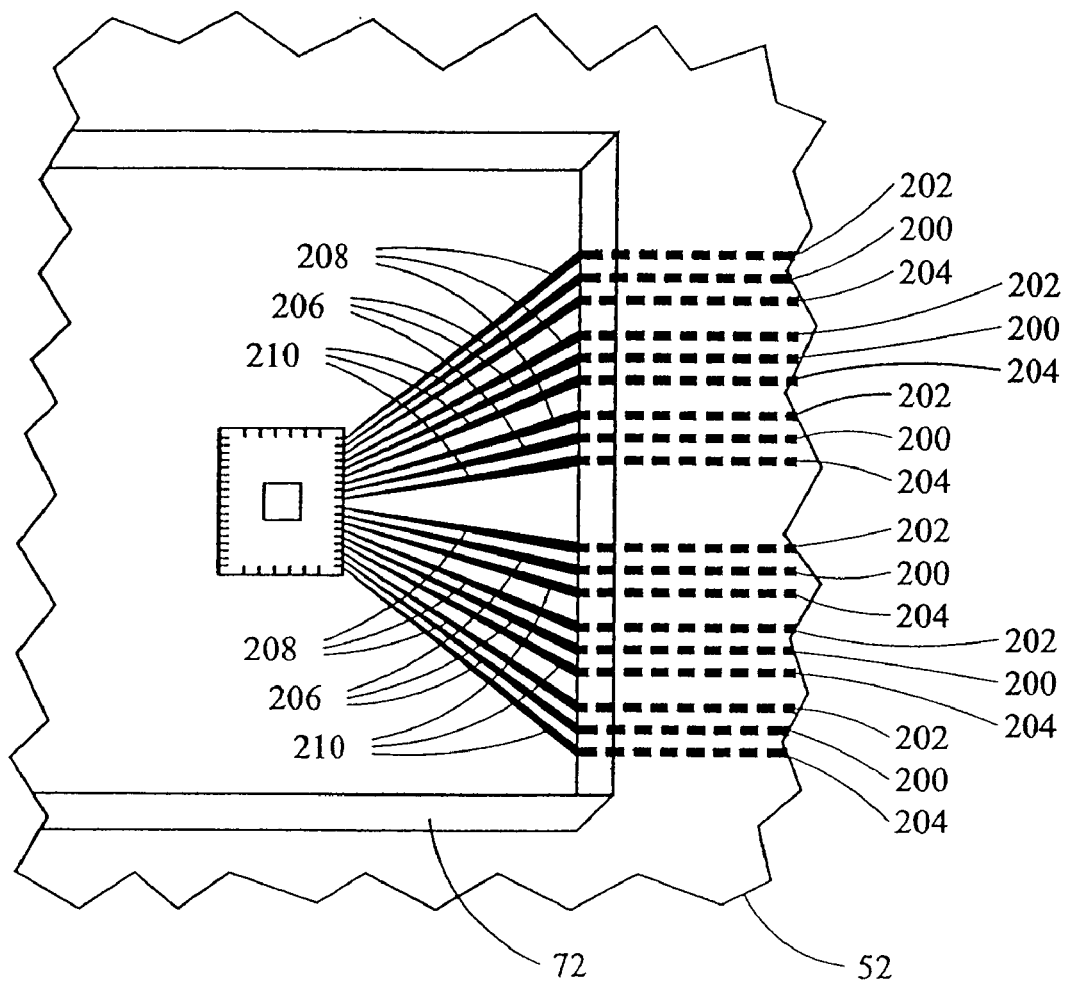
FIG. 13 is partial plan view of a membrane assembly and a probe card.

To further improve low-current measurement capability, the membrane assembly is constructed so as to likewise minimize leakage currents between the individual probing devices. Typically, this minimization involves the selection of membrane materials and likewise providing limited guarding of the signal conductor by a pair of guard conductors to a location proximate the probing device. Referring to FIG. 13, to provide the guarded path to a location proximate the probing devices each respective signal conductor 200 is located between a pair of respective guard conductors 202, 204 on the probe card 52, and the membrane assembly 72 likewise has a matching set of signal conductors 206 and guard conductors 208, 210. It is thought that this arrangement provides continuous sets of signal conductor/guard conductors to a location proximate the probing devices in a manner to achieve low leakage along nearly its entire length. However, even with the guarding of the signal conductors on the probe card 52 and the membrane assembly 72, the leakage current levels remain unacceptable for low-current low-noise measurements.

In other probe card designs, efforts have been directed toward systematically eliminating low-resistance leakage paths within the probe card and toward designing extensive and elaborate guarding structures to surround the signal conductors along the signal path. For example, in one design, the entire glass-epoxy main board is replaced with a board of ceramic material which presents a relatively high resistance to leakage currents. However, the ceramic material used in these newer designs is relatively more expensive than the glass-epoxy material it replaces. Another problem with ceramic materials is that they are relatively susceptible to the absorption of surface contaminants such as can be deposited by the skin during handling of the probe card. These contaminants can decrease the surface resistivity of the ceramic material to a sufficient extent as to produce a substantial increase in the leakage current levels. In addition, the more extensive and elaborate guarding structures that are used in these newer designs has contributed to a large increase in design and assembly costs.

It should be noted that there are other factors unrelated to design that can influence whether or not the potential of a particular probe card for measuring low-level currents will be fully realized. For example, if less special care is taken in assembling the probe card, it is possible for surface contaminants, such as oils and salts from the skin or residues left by solder flux, to contaminate the surface of the card and to degrade its performance (due to their ionic character, such contaminants can produce undesirable characteristics). Furthermore, even assuming that the card is designed and assembled properly, the card may not be suitably connected to the test instrument or the instrument may not be properly calibrated so as to completely null out, for example, the effects of voltage and current offsets. The probe card or the interconnecting lines can serve as pickup sites for ac fields, which ac fields can be rectified by the input circuit of the test instrument so as to cause errors in the indicated dc values. Thus, it is necessary to employ proper shielding procedures for (1) the probe card, (2) the interconnecting lines, and (3) the test instrument in order to shield out these field disturbances. Due to these factors, when a new probe card design is being tested, it can be extremely difficult to isolate the causes of undesirable background current in the new design due to numerous and possibly interacting factors that may be responsible.

Figure 14A:
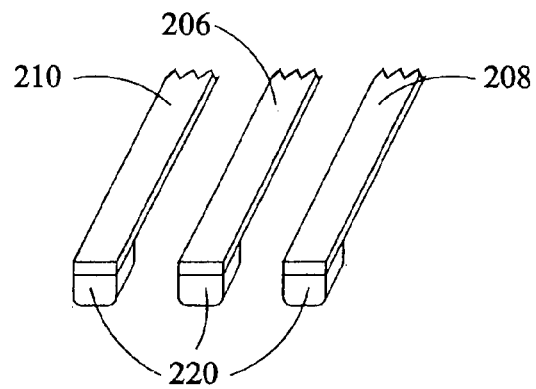
FIG. 14A is a partial pictorial view of the traces of a membrane assembly.
Figure 14B:
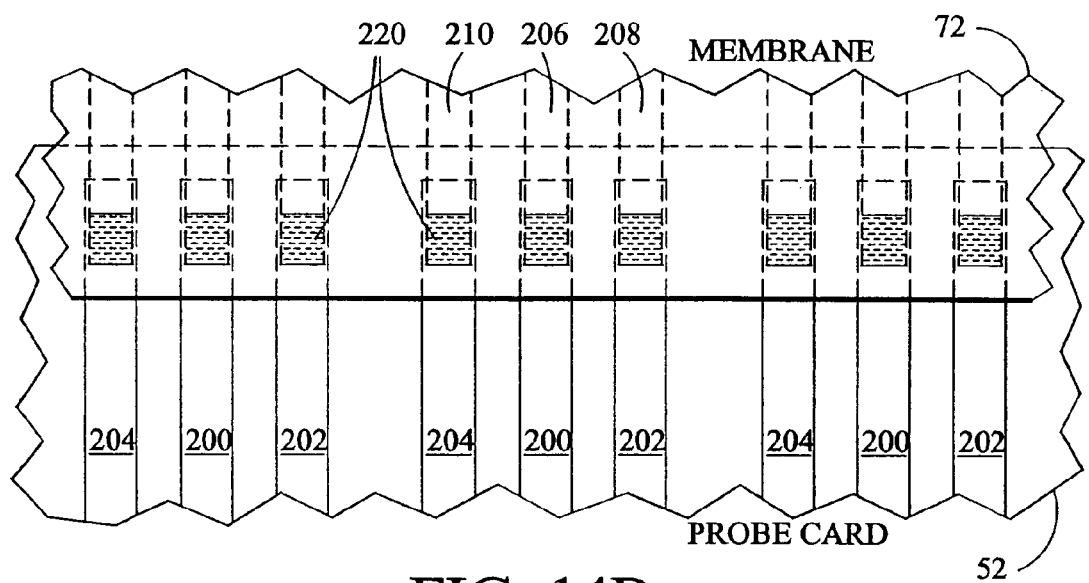
FIG. 14B is a partial plan view of the interconnection between a membrane assembly and a probe card.
Figure 14C:
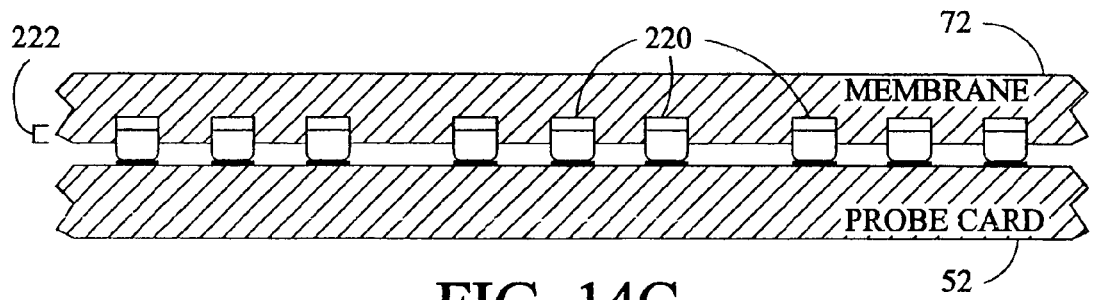
FIG. 14C is a partial sectional side view of the interconnection between the membrane assembly and the probe card of FIG. 14B.

The present inventors reconsidered a seemingly improbable source of noise, namely, the interconnection between the probe card 52 and the membrane assembly 72, which from initial considerations would appear to be effective at providing a guarded signal path to the probe device because of the "continuous" signal path upon interconnection. However, upon further consideration the present inventors determined that there is in fact significant unguarded and/or unshielded leakage paths existing in the region proximate the interconnection. Referring to FIG. 14A, each conductive path of the membrane is normally encapsulated within at least one layer of material (FIG. 14A illustrates multiple conductive paths without additional membrane materials). This provides a structure for routing conductive paths, such as the signal and guard conductors, to a location proximate the probing device without being on the exterior (lower surface) of the membrane assembly which may result in inadvertent contact with the device under test. Referring to FIGS. 14B-14C, the signal and guard lines are actually interconnected between the probe card 52 and the membrane assembly 72 by conductive structures 220 that pass through the outer layer 222 of the membrane assembly 72 to the interior conductive paths 206, 208, 210 of the membrane assembly 72. To form the electrical connection, the probe card 52 and membrane assembly 72 are mechanically aligned, and accordingly respective conductive structures 220 of the membrane assembly 72 are interconnected with the conductors 200, 202, 204 of the probe card 52. It is normally undesirable for the membrane assembly 72 interconnection to electrically connect at the absolute end of the conductors 200, 202, 204 (e.g., signal conductor and guard conductors) of the probe card 52 because then the tolerances for the interconnection would be extremely small, requiring nearly perfect alignment and extremely accurate fabrication. Accordingly, normally the signal and guard conductors supported by the probe card 52 extend beyond the region of electrical interconnection.

Figure 15:
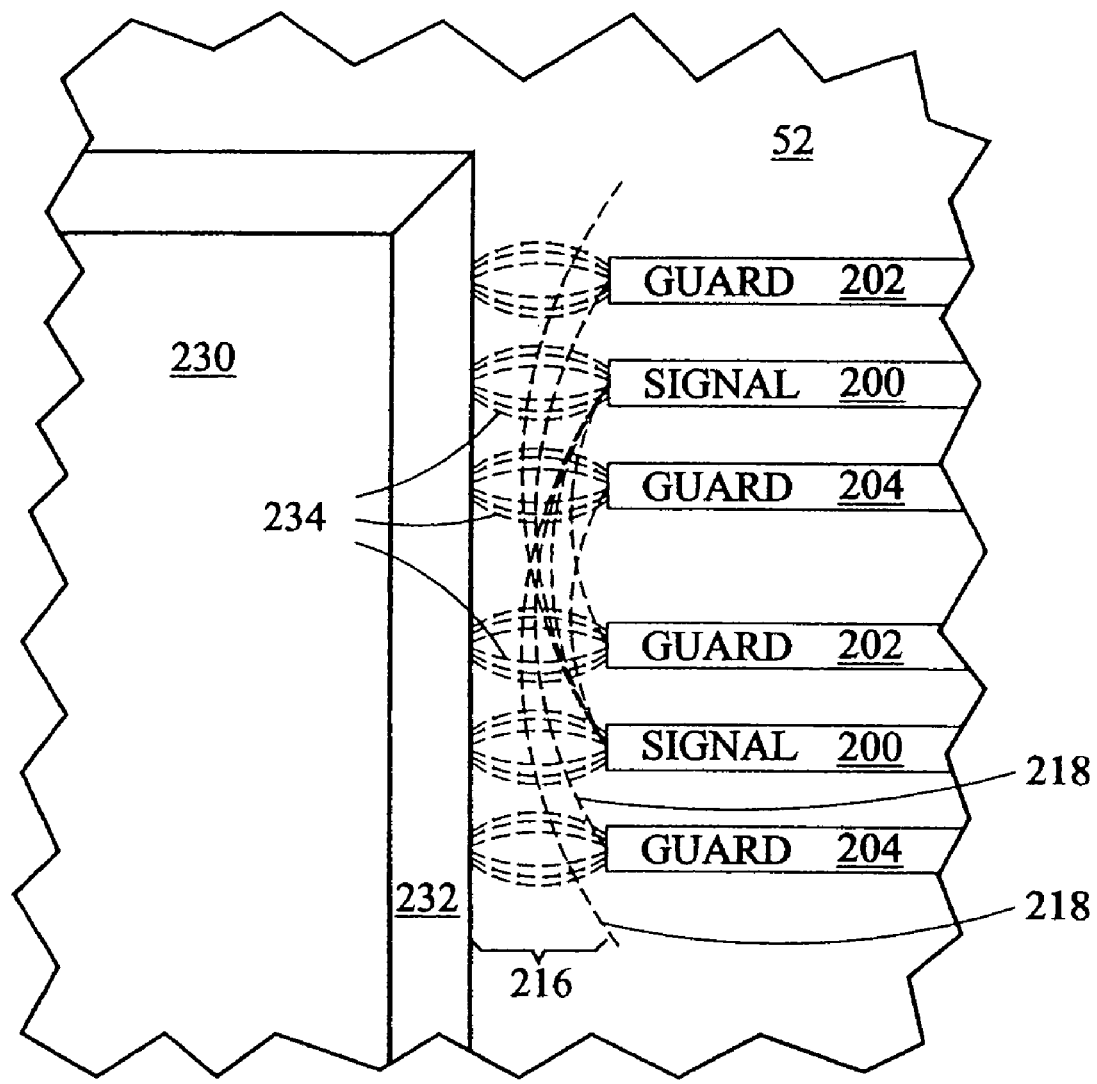
FIG. 15 is a partial sectional view of a probe card illustrating the leakage currents from the end portions of the signal and guard conductors.

After further consideration, the present inventors came the realization that this extension of the signal and/or guard conductors beyond the location of electrical connection results in significant additional leakage paths. Referring to FIG. 15, the region 216 beyond the end of the guard conductors provides for surface leakage paths 218, which are primarily DC in nature with the characteristic of an added resistance between the respective conductive paths. This surface leakage path from a signal conductor around the end of the adjacent guard conductors reduces the accuracy of measurements by increasing the leakage currents. Also, the present inventors likewise realized that the region 216 beyond the end of the guard conductors provides for a bulk leakage path, which is primarily AC (e.g., not DC) in nature with the characteristic of an added capacitance, between the signal conductor and the conductors beyond the adjacent guard conductors. This bulk leakage path from the signal conductor around the end of the adjacent guard conductors reduces the accuracy of measurements by increasing the leakage currents. It is to be noted that the guard conductors, in effect, impose a guard voltage into the bulk of the probe card in a region generally underneath the respective guard conductor. This reduces the bulk capacitive leakage currents from the interposed signal conductor in regions with an adjacent guard conductor.

In many embodiments, the opening 230 into which the membrane assembly 72 is supported includes a conductive surface 232 therein (e.g., guard, shield, ground) to further isolate the membrane assembly 72 from the probe card 52. Unfortunately, the conductive surface 232 results in significant fringe fields 234 (on the surface and in the bulk of the probe card 52) at the end of the signal conductors 200 and guard conductors 202, 204. These fringe fields 234 appear to the measuring device as an additional parallel capacitance and resistance. This fringe leakage path at the end of the guard and signal conductors 200, 202, 204 reduces the accuracy of measurements by increasing the leakage currents. The cumulative result of the additional bulk leakage currents, additional surface leakage currents, and additional fringe capacitance and resistance (leakage currents), appears to the measuring device as a capacitance and resistance lumped together with the measurements of the actual device under test. It is difficult, if not nearly impossible, to calibrate such additional leakage currents out of any measurements so that the true measurement of the device under test is obtained. Further, the additional capacitance results in an increase in the settling time of signals thereby increasing the time required to obtain a set of accurate measurements.

It is desirable to maximize the number of interconnections available between the probe card 52 and the membrane assembly 72 in order to provide the capability of probing an increasingly greater number of devices under test. While increasing the size of the membrane assembly 72 to provide a greater circumferential edge may be employed, it remains desirable to limit the size of the membrane assembly 72 to minimize the length of the conductive paths to reduce leakage currents.

To increase the number of interconnections available between the membrane assembly 72 and the probe card 52, the width of the conductors of the membrane assembly 72 and the probe card 52 may be decreased together with the spacing between the conductors. While decreasing the size of the conductor increases the number of interconnections for a given circumferential edge, this unfortunately results in an increased difficulty of aligning the respective conductive traces together. Further, the greater density increases the manufacturing expense of the device.

In general, the membrane assembly 72 is suitable for a higher density of conductive paths than the probe card 52. Accordingly, the initial limit to the number of interconnects is the ability to fabricate an increasingly greater number of conductive traces on the probe card 52.

Figure 16:
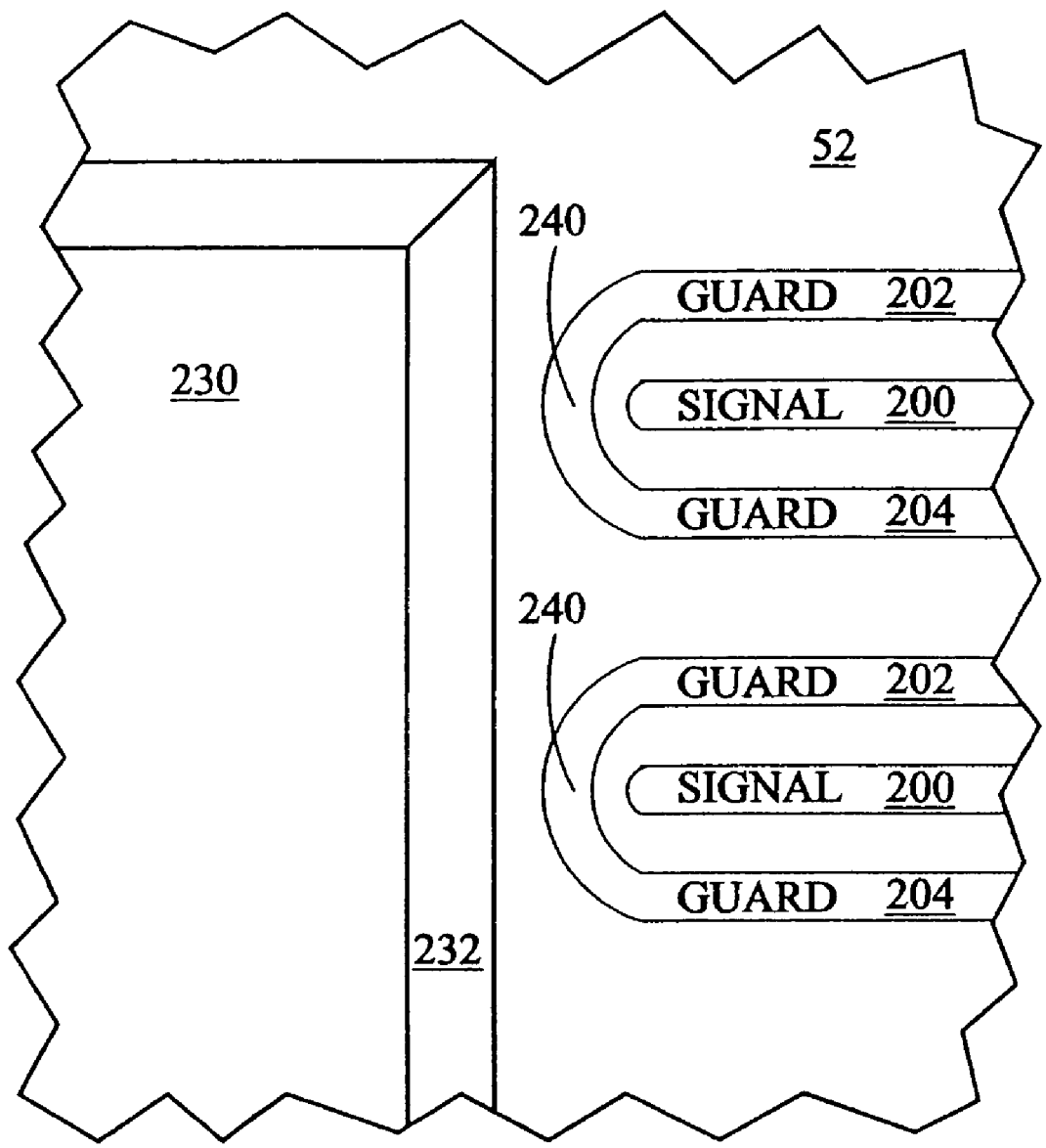
FIG. 16 is a partial sectional view of a probe card illustrating the interconnecting of a pair of guard conductors together with a signal conductor therebetween.

Referring to FIG. 16 the present inventors came to the realization that the preferred solution to overcome the aforementioned drawbacks of the presently accepted techniques is to interconnect the guard conductors around the end of the signal conductor, in contrast to the apparent solution of merely decreasing the feature size of the interconnects. The interconnecting portion 240 for each respective pair of guard conductors (effectively one electrical conductor) is preferably on the same plane, such as the top surface of the probe card 52, together with the guard conductors and signal conductors. The interconnecting portion 240 reduces the surface leakage path from the signal conductor by interposing a guarded path around the end of the signal conductor. In addition, the interconnecting portion 240 likewise decreases the bulk leakage path from a signal conductor by imposing a guard voltage in a region of the bulk of the probe card completely enclosing the end of the signal conductor. Also, the fringe leakage path to the central conductive surface 232 from the end of the signal conductor is substantially reduced, or otherwise eliminated, by providing the guarded interconnecting portion 240 around the end of the signal conductor. Reducing the leakage currents by including the additional interconnecting guard portion 240 results in the measurements made from the measuring device to be more accurate because less leakage currents are erroneously included in the measurements. In addition, a decrease in the settling time of the signals is achieved which reduces the time required to obtain a set of accurate measurements. One or more of the aforementioned drawbacks and/or advantages may be present and/or achieved depending upon the particular device and implementation.

Figure 17:
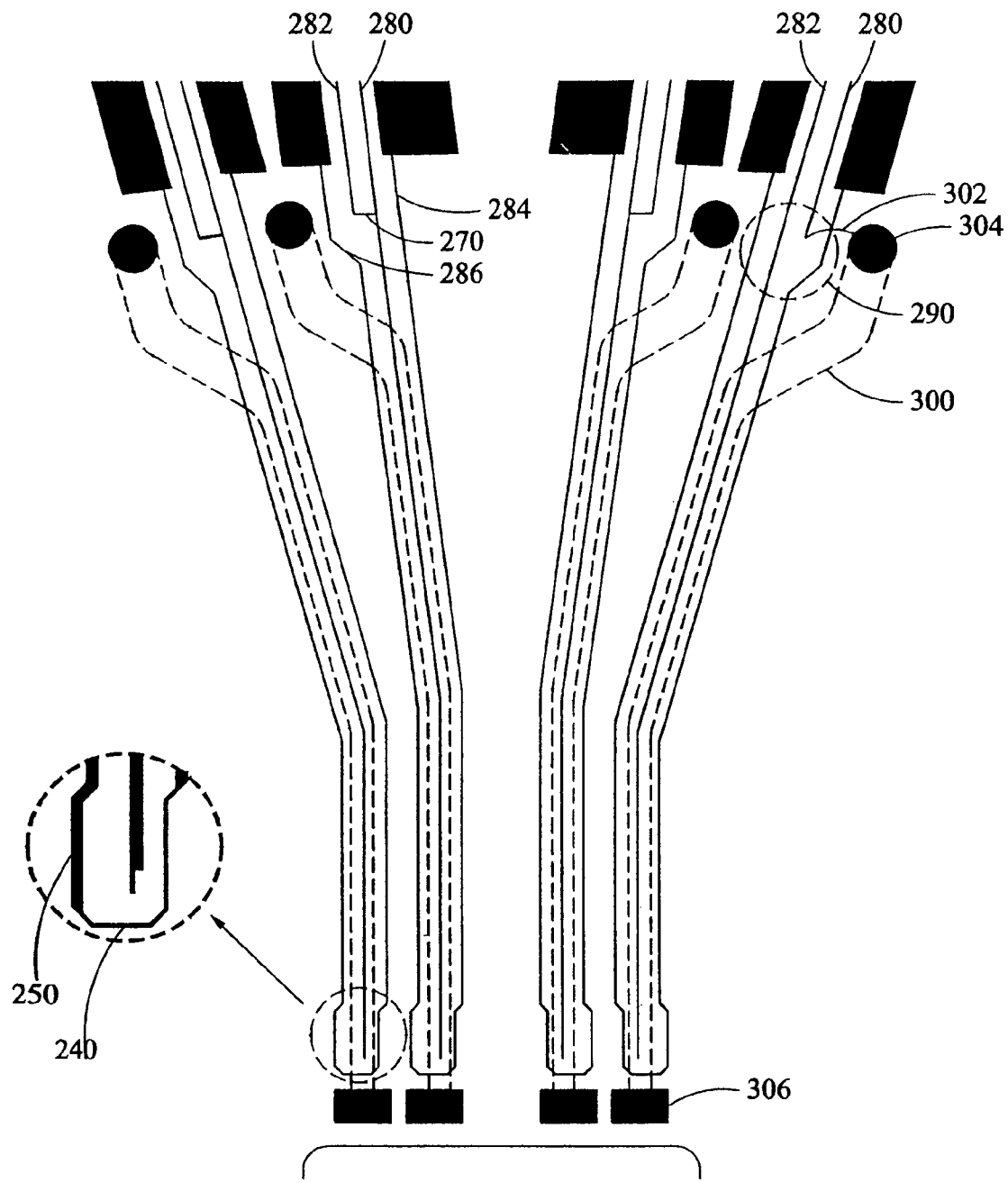
FIG. 17 is a partial plan view of a portion of a probe card illustrating power conductors, signal conductors, force conductors, sense conductors, removed interconnecting portions, and interconnected guard conductors.
Figure 18A:
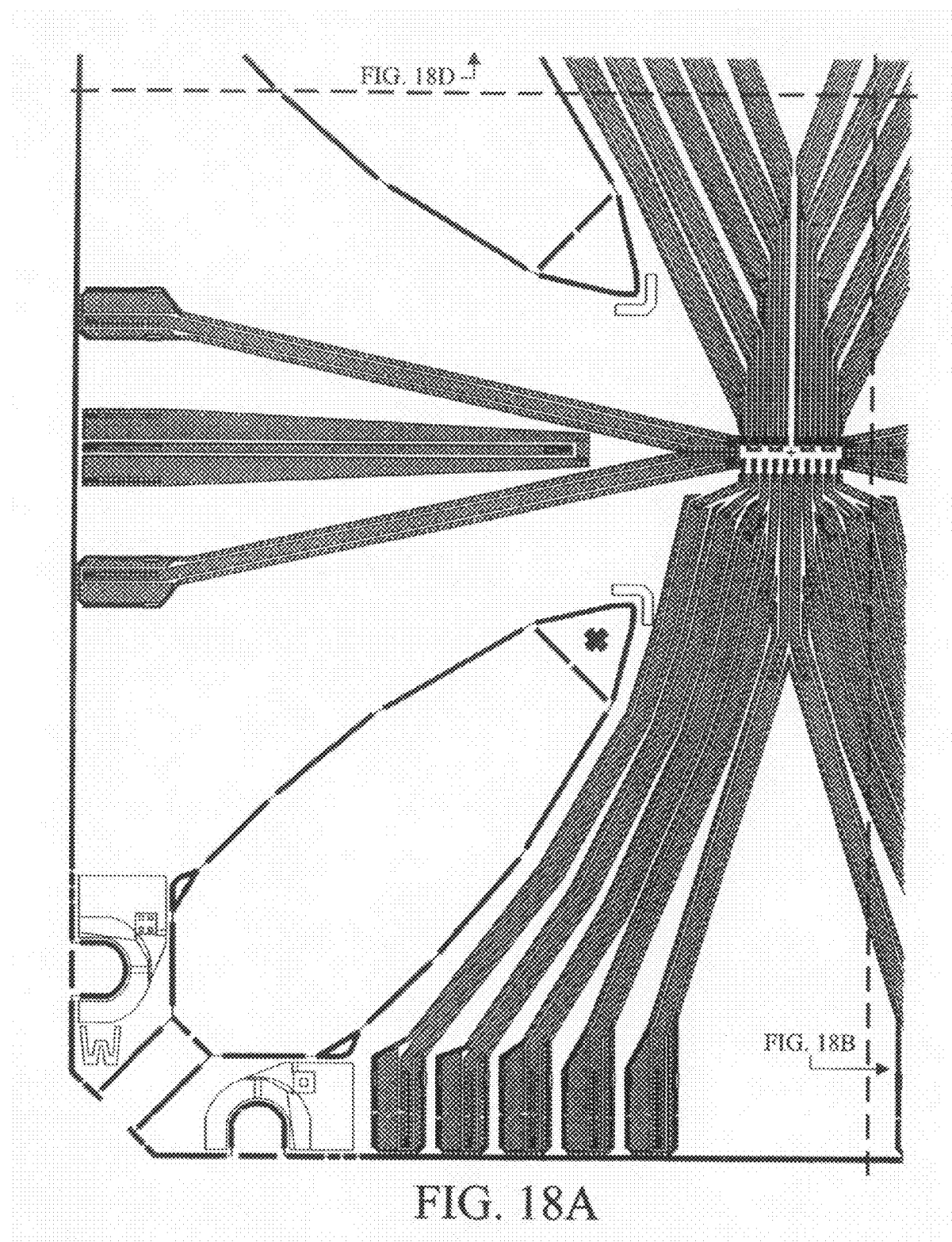
FIG. 18A is a partial plan view (including FIGS. 18B, 18C and 18D) of a portion of a membrane assembly illustrating signal conductors, force conductors, sense conductors, and interconnected guard conductors.
Figure 18B:
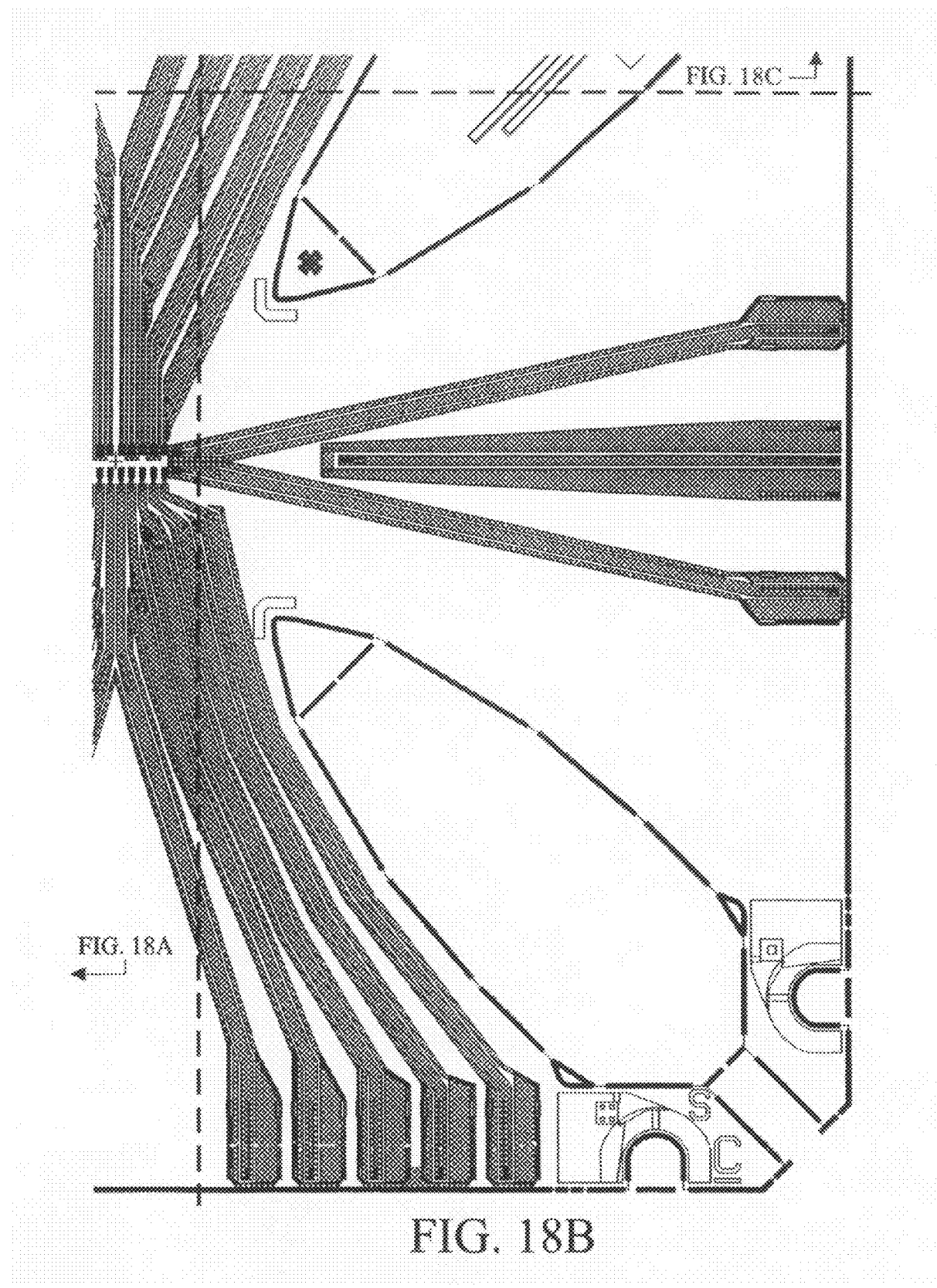
Figure 18C:
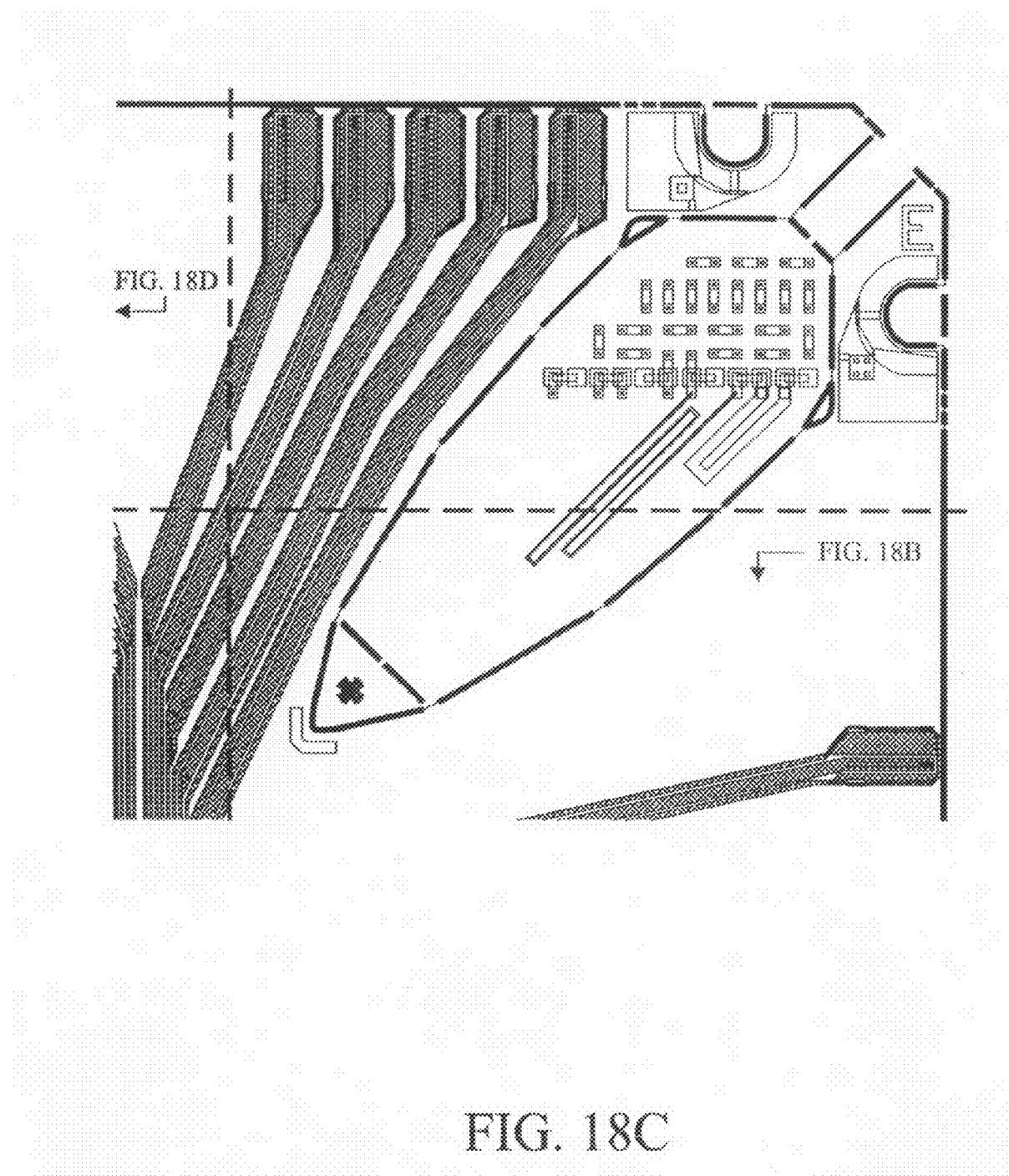
Figure 18D:
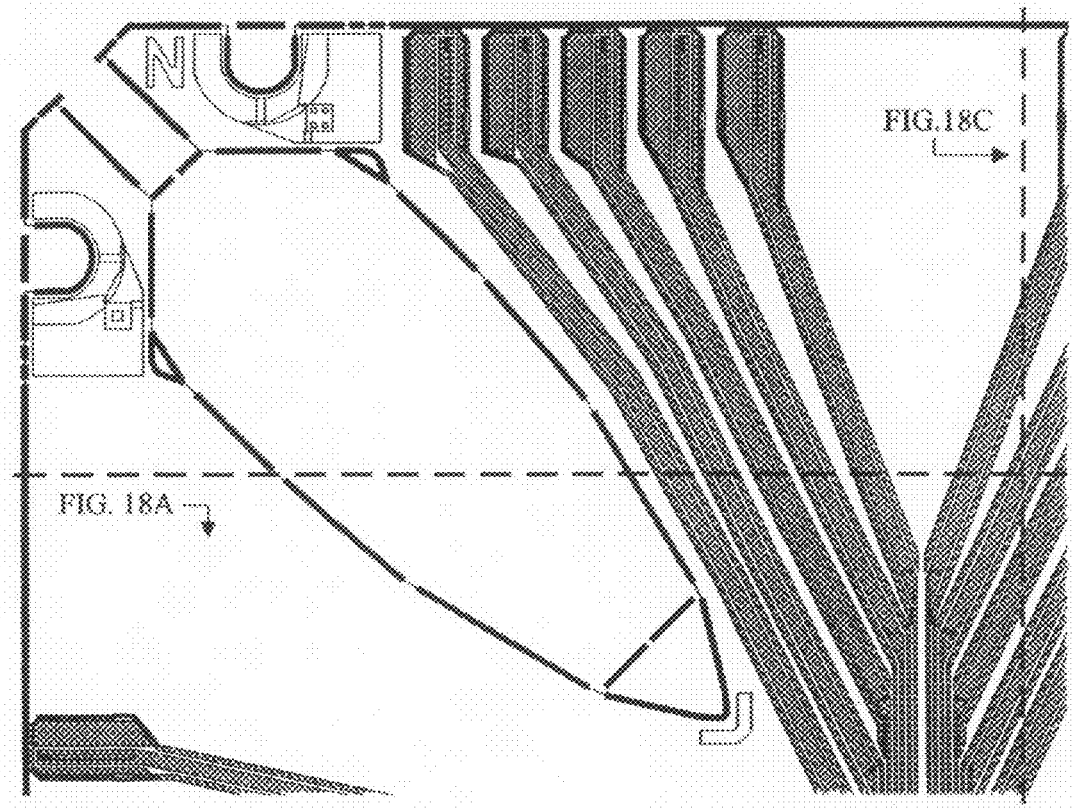

With the interconnecting portion 240 electrically interconnecting together a pair of guard conductors 202, 204 another benefit is more achievable, namely, increasing the number of potential interconnections, without necessarily changing the size of the membrane assembly 72, without necessarily changing the geometry of the individual conductors, and without necessarily decreasing the spacing between adjacent conductors. Referring to FIG. 17, the contacting region 250 for the contacts 220 of the membrane assembly 72 on the probe card 52 are provided on at least one side of the interconnected guard conductor 202, 204, 240. This permits easier alignment of the membrane assembly 72 and the probe card 52. The width of the guard conductor on the side generally opposite the contacting region may be considerably thinner because there is no contact by the membrane assembly 72 with that portion of the guard conductor. The different widths of the guard conductors proximate the end of the signal conductor permits a greater density of conductors to be achieved, if desired, without decreasing the mechanical tolerances required. A pair of contacts (one on either side of the signal conductor) may be used, if desired. As a result, the density of the interconnect between the probe card 52 and the membrane assembly 72 is closer to the capability of the membrane assembly 72.

Referring to FIGS. 18A to 18D, to provide a single contact between the pair of guard conductors on the probe card 52 and a respective pair of guard conductors of the membrane assembly 72, the guard conductors of the membrane assembly 72 preferably include an interconnecting guard portion 260 with the interdisposed signal conductor, in a manner similar to the interconnecting guard portion 240. The interconnecting membrane guard portion 260 provides many of the same advantages as described above with respect to the interconnecting probe guard portion 240. By including the interconnecting membrane guard portion 260, only a single conductive structure 220 needs to be provided between the membrane assembly 72 and the probe card 52 for each set of guard conductors.

Ideally in a two lead conductor system a "true Kelvin" connection is constructed. This involves using what is generally referred to as a force signal and a sense signal. The signal conductor from one of the two conductors is considered the force conductor, while the signal conductor from the other of the two conductors is considered the sense conductor. The force conductor is brought into contact with a test pad on the wafer. The force conductor is a low impedance connection, so a current is forced through the force conductor for testing purposes. The sense conductor is a high impedance connection and is also brought into contact with the same test pad (or a different test pad) on the wafer, preferably in close proximity to the sense conductor, in order to sense the voltage. As such the current versus voltage characteristics of the test device can be obtained using the force and sense conductors.

Figure 19:
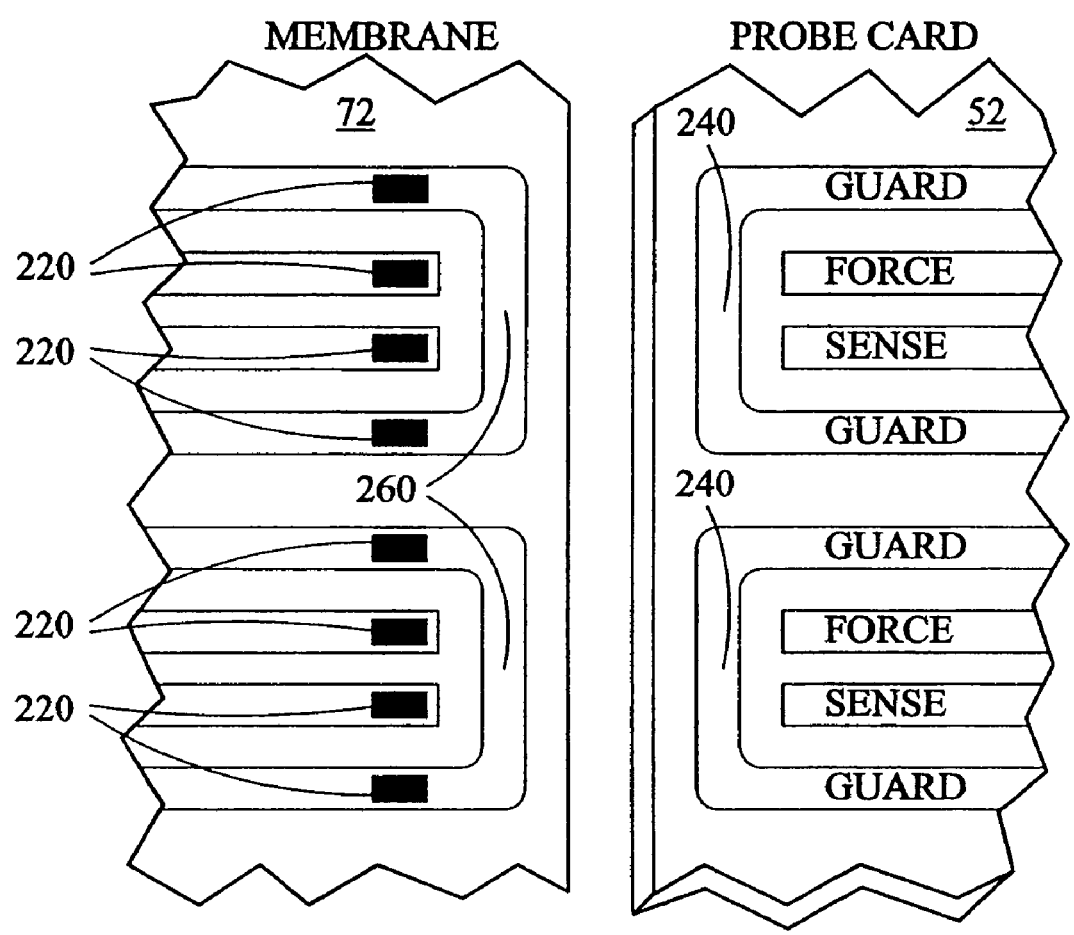
FIG. 19 is a partial plan view of a probe card and a membrane assembly suitable for a Kelvin connection.

Referring to FIG. 19, one potential technique to achieve a Kelvin connection with the membrane probing system is to design the probe card 52 to include multiple sets of a force conductor, a sense conductor, and a corresponding pair of guard connectors on opposing sides of the force/sense conductors (preferably with the interconnection portion). The membrane assembly 72 likewise includes corresponding sets of a force conductor, a sense conductor, and guard conductors (preferably with the interconnecting portion). This provides a potential technique for achieving a Kelvin connection but unfortunately this wastes interconnection space on the probe card 52 in the event that a Kelvin connection for any particular device under test is not necessary. Alternatively, the probe card 52 may be redesigned for each membrane probing assembly, which is typically unique for each application. However, redesigning the probe card 52 for each application is expensive and not generally an acceptable solution.

While considering how to maintain one or more standard probe cards 52, together with providing Kelvin connections for each line, the present inventors initially observed that the probe card 52 has more available surface area for routing the conductors further from the interconnection between the probe card 52 and the membrane assembly 72. With the additional surface area at regions not proximate the interconnection between the probe card 52 and the membrane assembly 72, a pair of conductive traces 280, 282 are easily routed, the pair being located between a pair of guard conductors 284, 286, to a location generally proximate the interconnection (see FIG. 17). For non-Kelvin measurements, one of the conductors may be used as the signal line with the remaining interconnected conductor not used. If desired, the interconnection 270 between the two interconnected signal conductors may be removed (open-circuited) for low noise measurements. However, with the two signal conductors (e.g. force and sense) normally interconnected it is a simple matter to break the interconnection 270 by removing a portion of conductors at region 290. In the event of "quasi-Kelvin" connections, the interconnection portion may be maintained and one of the pair of conductors 280, 282 would be used as a force conductor and the other conductor of the pair would be used as a sense conductor. Quasi-Kelvin connections are generally formed by the interconnection of a sense conductor and a force conductor at a point before the device under test.

To accomplish effective probing with the membrane assembly 72, typically low impedance power conductors 300 are provided on the probe card 52 to supply power to the probing devices of the membrane assembly 72. The present inventors determined that the interconnection 270 between the pair of conductors may be removed and the force conductor 280 may be jumpered with a wire bond 302 (or any other suitable technique) to an unused power conductor on the probe card 52. Each of the power conductors 300 on the probe card 52 are preferably conductive members within the bulk of the probe card 52, electrically connected to the surface of the probe card 52 by using a set of vias 304, 306. Each power conductor is routed to a location proximate the interconnection between the probe card 52 and the membrane assembly 72. The power conductor is normally a low impedance conductor. Because the force conductor is a low-impedance connection designed to carry significant current it is preferable to locate the force conductor outside of the guards 284, 286 of its corresponding sense conductor. In addition, because the force conductor is a low-impedance path carrying significant (non-negligible) current levels it does not necessarily require the guarding provided by the guard conductors 284, 286 on opposing sides of the sense conductor 282.

The power conductors, to which force conductors may be interconnected with, are preferably routed within the bulk of the probe card 52 in a region directly underneath the corresponding sense conductor. The conductive power conductor provides additional protection for the sense conductor to minimize leakage currents. Alternatively, the power conductor may be routed on the top surface (or bottom surface) of the probe card, if desired.

The power conductor is preferably routed to a point "interior" to the end of the corresponding signal conductor using a "via" 306 to the upper surface of the probe card 52. Accordingly, the power conductor is available at a location suitable for interconnection to the membrane assembly 72, if desired, while likewise being available for interconnection as a force conductor. In this manner, the same power conductor may be used to provide power to the device under test, while likewise providing a force connection, both of which in a manner that maintains the density of the interconnection of the interface between the probe card 52 and the membrane assembly 72. The actual use of the power conductors depends on the application and the particular design of the membrane assembly 72.

Figure 20:
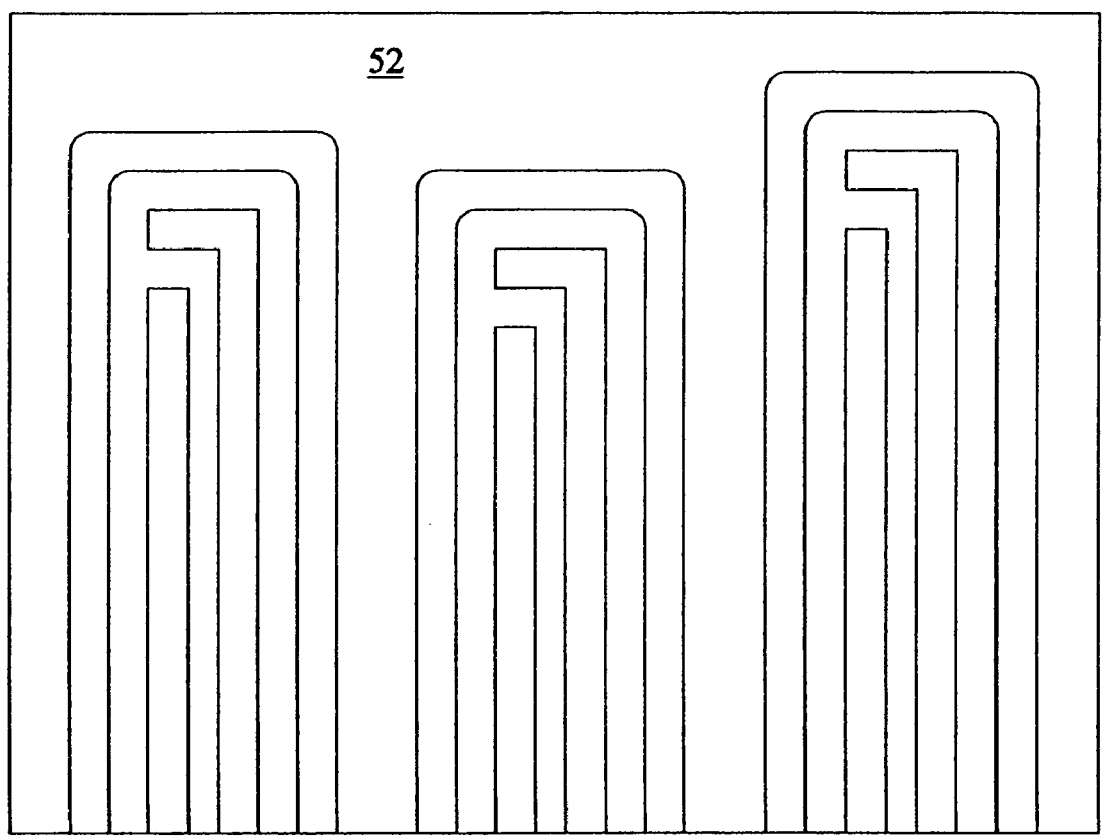
FIG. 20 is a partial plan view of a probe card illustrating different geometries for the interconnection to a membrane assembly.

Another technique suitable to provide a greater density of interconnects, and their corresponding interconnecting regions (normally having a greater surface area for contact to the membrane assembly 72) is to align the interconnects of the probe card 52 in a non-linear fashion (e.g., some closer and some farther from the edge of the probe card 52) around the circumference of the membrane assembly 72, as shown in FIG. 20. A further technique suitable to provide a greater density of interconnects, is to align the interconnecting regions in an overlapping manner with respect to a direction perpendicular to the adjacent membrane assembly 72. The membrane assembly 72 would likewise have corresponding structures suitable to interconnect to the two-dimensional structure of the conductors of the probe card 52.

Figure 21:
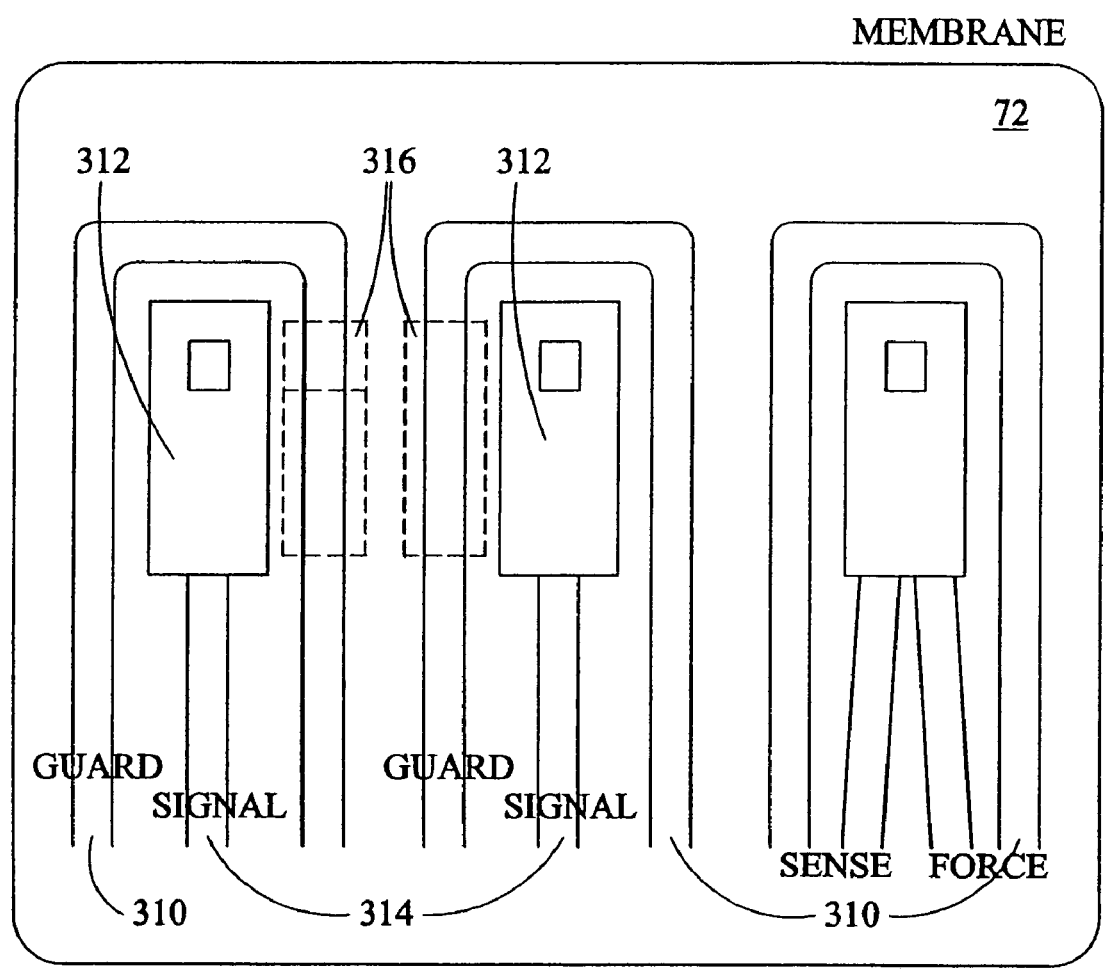
FIG. 21 is a partial plan view of a membrane assembly illustrating a guard conductor looping around a respective probing device.

The present inventors came to the realization that the membrane assembly is susceptible to absorption of moisture which increases the leakage currents within the membrane assembly. Referring to FIG. 21, another structure suitable to reduce leakage currents for the probing devices is shown. Preferably, the guarded conductors 310 of the membrane assembly 72 encircle the end of the probing device 312, with the signal conductor connected thereto 314. Preferably, the guarded conductors 310 are within the bulk of the membrane assembly 72 to prevent their inadvertent contact with the device under test. Providing the guarded probing devices significantly reduces the effects of leakage currents between the probing devices, especially due to the effects of humidity. However, the present inventors determined that the surface leakage currents between adjacent probing devices may be reduced by removing at least a portion of the membrane material (dielectric) 316 in a location proximate a portion of the guard conductors 310 and between the probing devices 312. In this manner, a portion of the guard conductor 310 will be exposed to the surface, albeit somewhat recessed from the surface of the membrane assembly 72, thereby impeding the passage of surface leakage between probing devices 312.

Figure 22A:
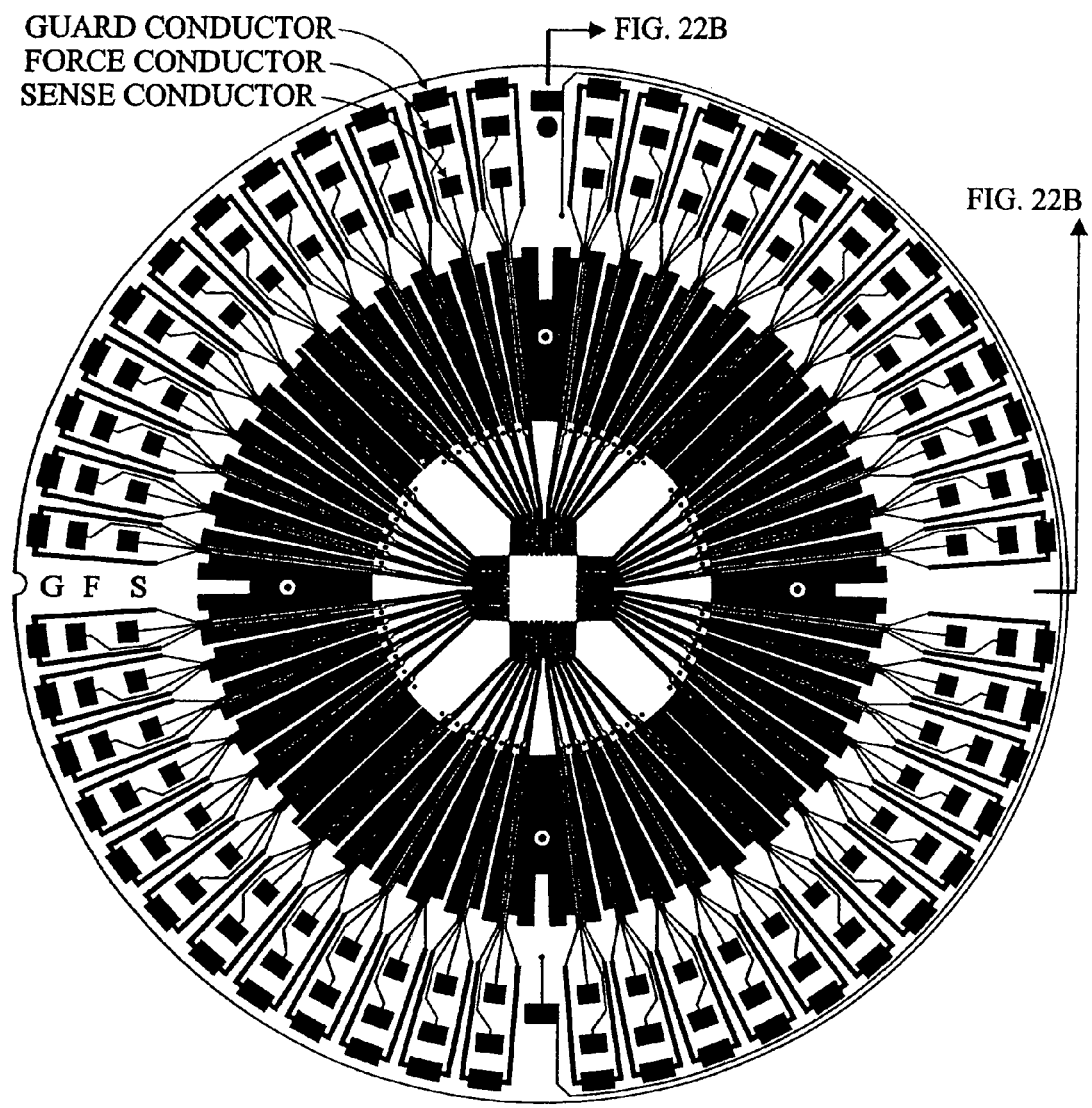
FIG. 22A is a plan view (including FIGS. 22B and 22C) of a "pogo-pin" probe card constructed in accordance with aspects of the present invention, where the connections to the probe card are normally electrical contacts from a probe ahead positioned above the probe card.
Figure 22B:
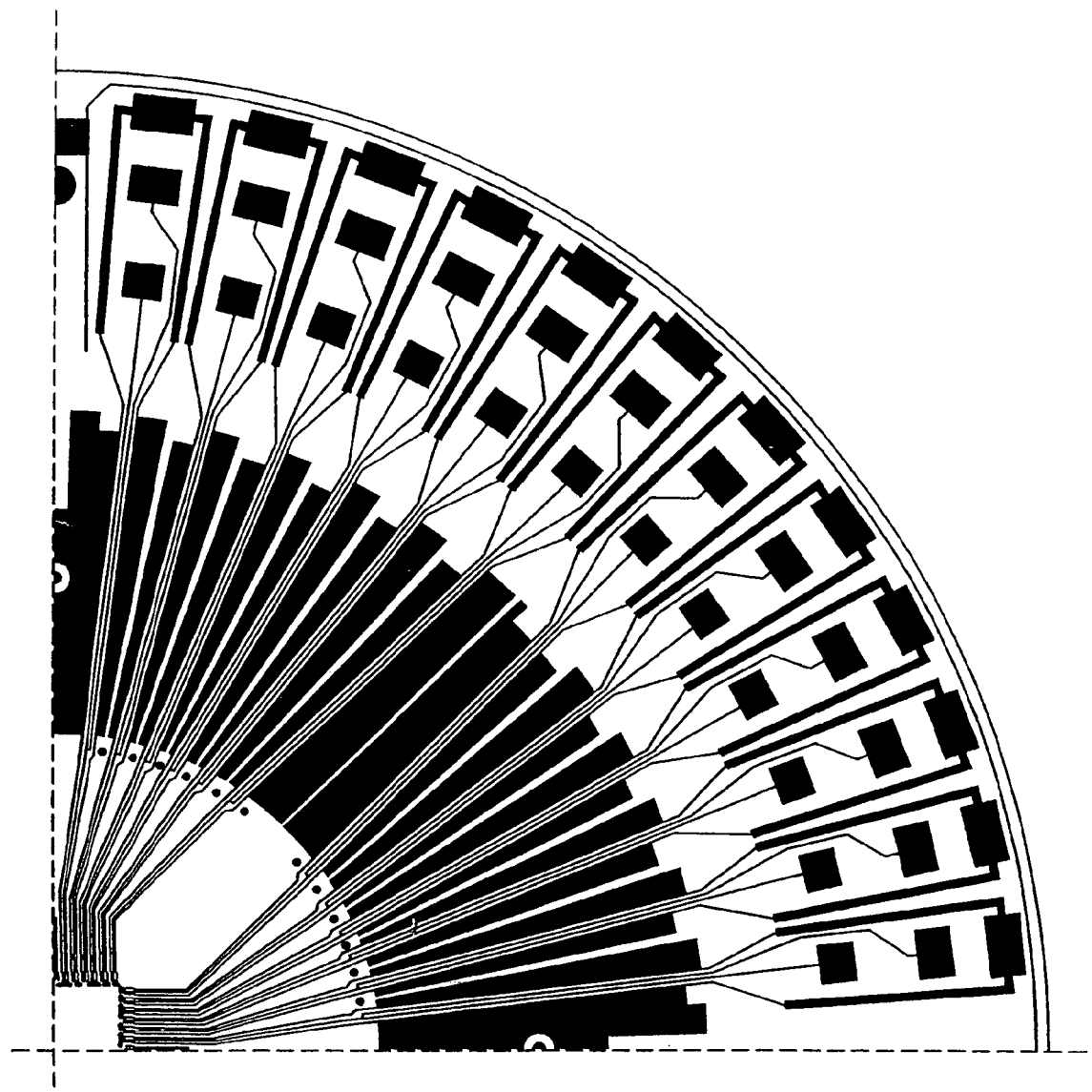
Figure 22C:
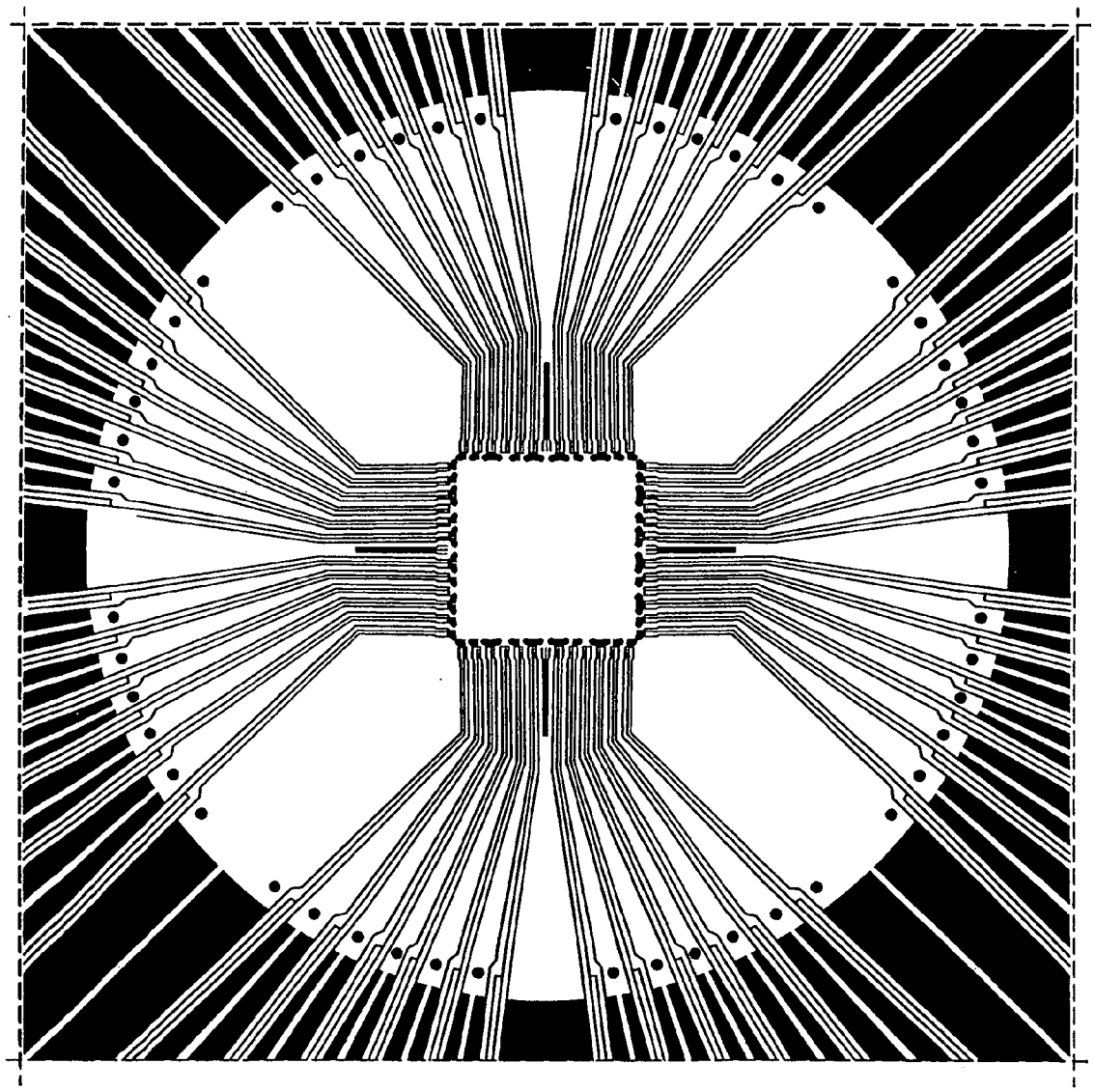

Referring to FIGS. 22A to 22C, in one embodiment of the present invention a pogo pin probe card includes guarded signal paths and is suitable for receiving a progo pin probe head for connection thereto.

Figure 23:
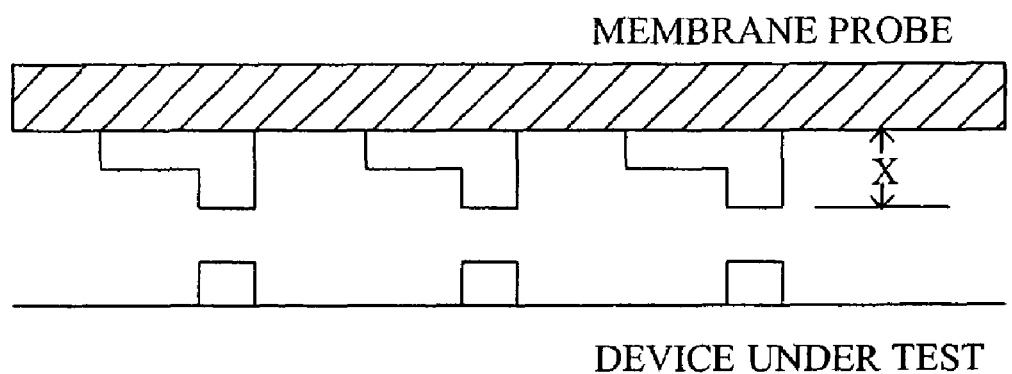
FIG. 23 illustrates three probing devices with the same elevation for probing a device under test.
Figure 24:
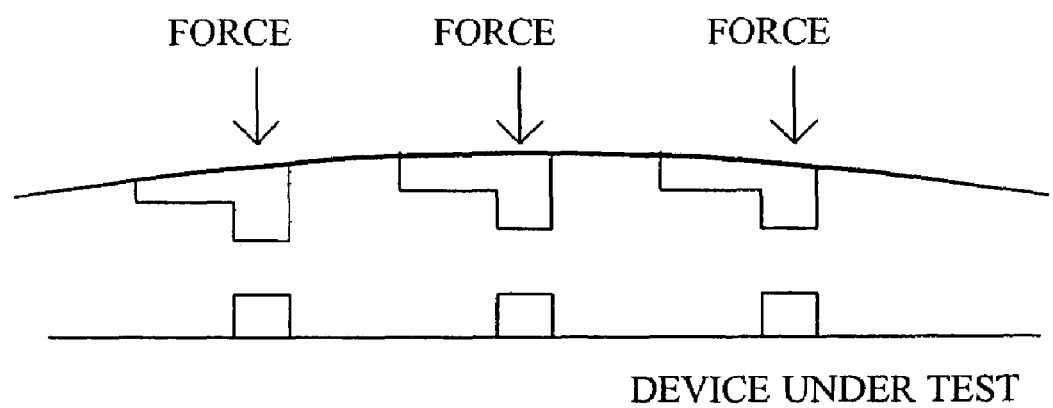
FIG. 24 illustrates three probing devices with different elevations for probing a device under test.

When probing using the membrane probe it is undesirable to exert excessive pressure on the device under test. Under normal probing conditions it is traditionally considered desirable to have all of the contacting portions of the probing device to have a uniform height so that uniform contact may be made upon the device under test, as shown in FIG. 23. After consideration of the traditional design that the contacting portions have a uniform height, the present inventors were amazed to come to the realization that the membrane itself, to which the contacting portions are supported tends, tends to arch or otherwise become non-planar, as shown in FIG. 24. This bending of the membrane itself tends to exert additional pressure on the exterior probing devices, while the membrane and exterior probing devices together tend to exert an opposing upwardly directed force on the interior probing device. This set of forces tends to result in a decrease in the pressure of the interior probing device. Accordingly, to obtain consistent test measurements, excessive pressure needs to be exerted on the contacting portions to ensure adequate contact for all of the probing devices. To overcome this newly realized limitation, the present inventors determined that some of the contacting portions should have a non-uniform height relative to the other contacting portions. This non-uniform height may be relative to other contacting portions, the membrane, and/or the pad elevations of the device under test. In other words, when making contact with the device under test different ones of the contacting portions should make initial contact with the device under test as different pressures are exerted. Preferably, when a guard-signal-guard arrangement is probed using three probing devices the interior probing device has a greater height, such as 2 microns higher than its neighboring probing devices. It is also to be understood that this non-uniform probing may be at different localized regions across the membrane.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A probing assembly for probing an electrical device comprising:
   (a) a support;
   (b) a membrane in overlying relationship to said support;
   (c) a first elongate conductor supported by said membrane;
   (d) a first contact supported by said membrane, said contact electrically connected to said first elongate conductor and having a first contact thickness measured perpendicularly from said membrane to the outermost point on a contacting surface of said first contact;
   (e) a pair of additional conductors supported by said membrane, where said first elongate conductor is located between said pair of additional conductors;
   (f) said pair of additional conductors are electrically interconnected together in a manner extending substantially around an end of said first elongate conductor; and
   (g) a second contact electrically connected to a second elongate conductor and having a second contact thickness measured perpendicularly from said membrane to the outermost point on a contacting surface of said second contact, where said second contact thickness is different from said first contact thickness.

2. The probing assembly of claim 1 wherein said first elongate conductor and said pair of additional conductors are on the same plane.

3. The probing assembly of claim 1 wherein said pair of additional conductors are non-symmetrical with respect to said first conductor.

4. The probing assembly of claim 1 wherein said pair of additional conductors have different widths proximate said end of said first conductor.

5. The probing assembly of claim 1 further comprising a second elongate conductor supported by said membrane and said second elongate conductor is located between said pair of additional conductors.

6. The probing assembly of claim 5 wherein said first conductor is a force connection and said second conductor is a sense connection.

* * * * *